US010531550B2

(12) United States Patent
Yabu

(10) Patent No.: US 10,531,550 B2
(45) Date of Patent: Jan. 7, 2020

(54) EXTREME ULTRAVIOLET LIGHT GENERATION DEVICE

(71) Applicant: Gigaphoton Inc., Tochigi (JP)

(72) Inventor: Takayuki Yabu, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 15/888,109

(22) Filed: Feb. 5, 2018

(65) Prior Publication Data
US 2018/0173102 A1 Jun. 21, 2018

Related U.S. Application Data

(63) Continuation of application No. PCT/JP2015/076912, filed on Sep. 24, 2015.

(51) Int. Cl.
*H05G 2/00* (2006.01)
*G03F 7/20* (2006.01)

(52) U.S. Cl.
CPC ......... *H05G 2/006* (2013.01); *G03F 7/70025* (2013.01); *G03F 7/70033* (2013.01); *G03F 7/7055* (2013.01); *H05G 2/008* (2013.01)

(58) Field of Classification Search
None
See application file for complete search history.

(56) References Cited

U.S. PATENT DOCUMENTS

| 8,809,823 B1* | 8/2014 | Senekerimyan | H05G 2/008 250/504 R |
| 9,426,872 B1* | 8/2016 | Riggs | H05G 2/008 |
| 2004/0105095 A1* | 6/2004 | Stobrawa | H05G 2/003 356/318 |

(Continued)

FOREIGN PATENT DOCUMENTS

| JP | S63-002300 A | 1/1988 |
| JP | 2006-505960 A | 2/2006 |

(Continued)

OTHER PUBLICATIONS

International Search Report issued in PCT/JP2015/076912; dated Dec. 22, 2015; with English Translation.

(Continued)

*Primary Examiner* — Michael J Logie
(74) *Attorney, Agent, or Firm* — Studebaker & Brackett PC

(57) ABSTRACT

An extreme ultraviolet light generation device may include: a chamber in which extreme ultraviolet light is generated from plasma generated by irradiating a target with laser light output by a laser device, in a generation region therein; a target supply unit configured to output the target as a droplet toward the generation region; a droplet detector configured to detect the droplet in a detection region; and a controller. The droplet detector may transmit, to the controller, a pass timing signal indicating a timing when the droplet passes through the detection region. The controller may include a noise compensation unit configured to compensate for noise of the pass timing signal caused by an electromagnetic wave from the plasma, and transmit a trigger signal that gives a trigger to output the laser light to the laser device based on the pass timing signal in which the noise is compensated for.

8 Claims, 23 Drawing Sheets

(56) References Cited

U.S. PATENT DOCUMENTS

| | | | |
|---|---|---|---|
| 2005/0199829 A1* | 9/2005 | Partlo | B82Y 10/00 |
| | | | 250/504 R |
| 2011/0273691 A1 | 11/2011 | Buurman et al. | |
| 2013/0062538 A1 | 3/2013 | Kodama et al. | |
| 2013/0062539 A1 | 3/2013 | Hayashi et al. | |
| 2013/0119232 A1* | 5/2013 | Moriya | G01J 1/4257 |
| | | | 250/201.1 |
| 2014/0098830 A1* | 4/2014 | Yabu | H05G 2/005 |
| | | | 372/30 |
| 2014/0353528 A1* | 12/2014 | Hayashi | H05G 2/008 |
| | | | 250/504 R |
| 2015/0083898 A1* | 3/2015 | Senekerimyan | H05G 2/008 |
| | | | 250/214.1 |
| 2015/0179401 A1* | 6/2015 | Gambino | H05G 2/006 |
| | | | 250/573 |
| 2015/0261095 A1 | 9/2015 | Jansen et al. | |
| 2016/0066401 A1 | 3/2016 | Yabu et al. | |
| 2017/0064799 A1* | 3/2017 | Yabu | G03F 7/70033 |

FOREIGN PATENT DOCUMENTS

| | | | |
|---|---|---|---|
| JP | 2007-123294 A | 5/2007 | |
| JP | 2009-095826 A | 5/2009 | |
| JP | 2011-003887 A | 1/2011 | |
| JP | 2011-238921 A | 11/2011 | |
| JP | 2013-062146 A | 4/2013 | |
| JP | 2014-078394 A | 5/2014 | |
| JP | 2014-235805 A | 12/2014 | |
| JP | 2014-534559 A | 12/2014 | |
| JP | 2015-524599 A | 8/2015 | |
| WO | 2004/012308 A2 | 2/2004 | |
| WO | 2014/203804 A1 | 12/2014 | |

OTHER PUBLICATIONS

International Preliminary Report on Patentability and Written Opinion of the International Searching Authority issued in PCT/JP2015/076912 dated Mar. 27, 2018; with English Translation.

An Office Action mailed by the Japanese Patent Office dated May 21, 2019, which corresponds to Japanese Patent Application No. 2017-541193 and is related to U.S. Appl. No. 15/888,109; with English translation.

* cited by examiner

RELATED ART

RELATED ART

FIG.10
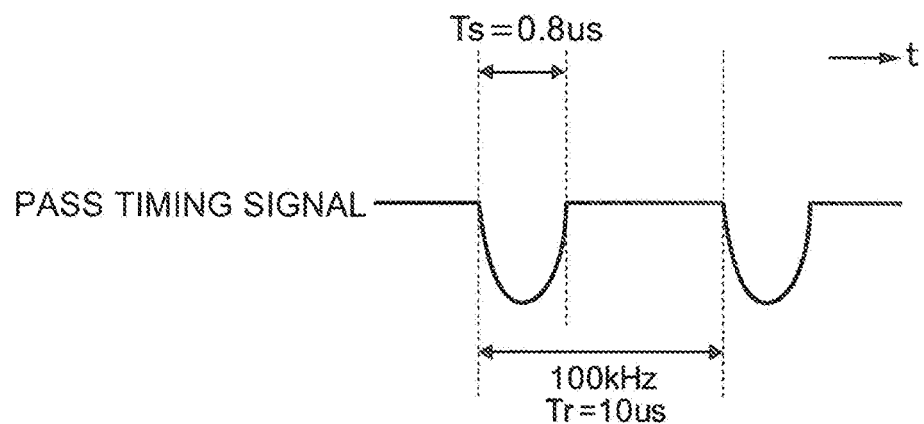
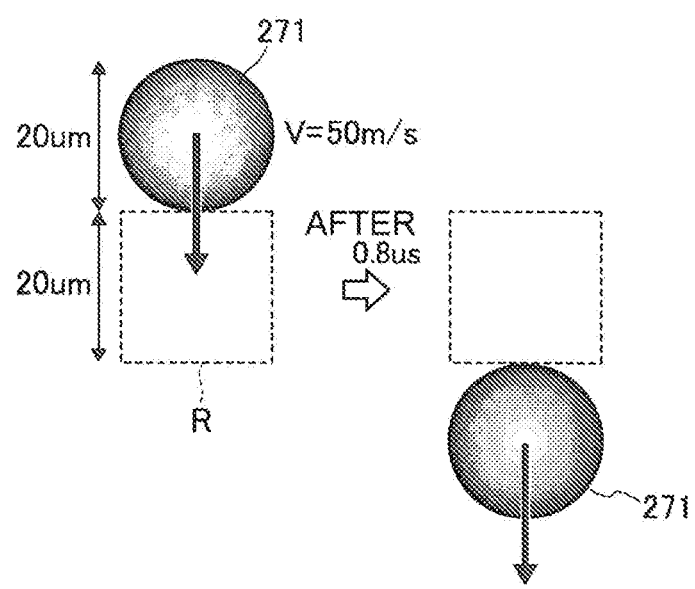

| VELOCITY CORRECTION AMOUNT v | PRESSURE CORRECTION AMOUNT p |
|---|---|
| p1 | v1 |
| p2 | v2 |
| ⋮ | ⋮ |
| pn | vn |

FIG.18
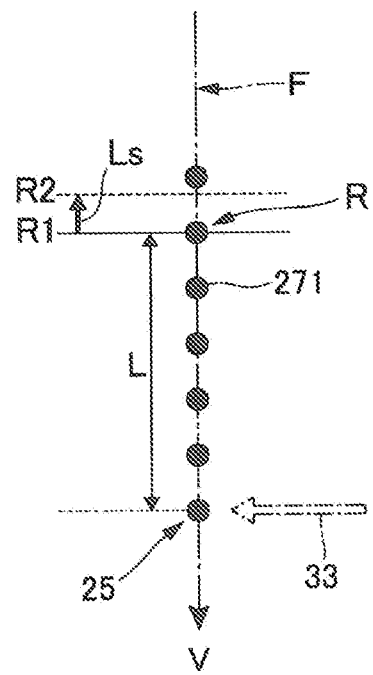
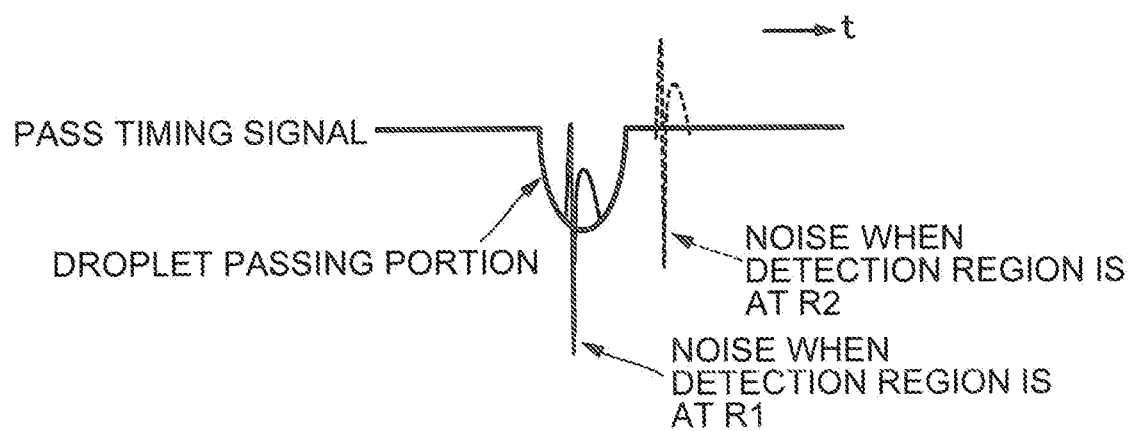

EXTREME ULTRAVIOLET LIGHT GENERATION DEVICE

CROSS-REFERENCE TO RELATED APPLICATIONS

The present application is a continuation application of International Application No. PCT/JP2015/076912 filed on Sep. 24, 2015. The content of the application is incorporated herein by reference in its entirety.

BACKGROUND

1. Technical Field

The present disclosure relates to an extreme ultraviolet light generation device.

2. Related Art

In recent years, along with miniaturization of a semiconductor process, miniaturization of a transfer pattern in photolithography of a semiconductor process has been developed rapidly. In the next generation, fine processing of 20 nm or less will be demanded. It is expected to develop an exposure device in which a device for generating extreme ultraviolet (EUV) light having a wavelength of about 13 nm and reduced projection reflective optics are combined.

As EUV light generation devices, three types of devices are proposed, namely an LPP (Laser Produced Plasma) type device using plasma generated by radiating laser light to a target, a DPP (Discharge Produced Plasma) type device using plasma generated by electric discharge, and an SR (Synchrotron Radiation) type device using orbital radiation light.

CITATION LIST

Patent Literature

Patent Literature 1: Japanese Patent Application Laid-Open No. 2011-003887
Patent Literature 2: National Publication of International Patent Application No. 2014-534559
Patent Literature 3: Japanese Patent Application Laid-Open No. 2009-095826
Patent Literature 4: Japanese Patent Application Laid-Open No. 2013-062146

SUMMARY

An extreme ultraviolet light generation device, according to one aspect of the present disclosure, may be an extreme ultraviolet light generation device used together with a laser device configured to output laser light. The extreme ultraviolet light generation device may include a chamber, a target supply unit, a droplet detector, and a controller. The chamber may be configured such that extreme ultraviolet light is generated from plasma that is generated when a target is irradiated with the laser light in a generation region inside the chamber. The target supply unit may be configured to output the target as a droplet toward the generation region inside the chamber. The droplet detector may be configured to detect the droplet in a detection region located between the target supply unit and the generation region. The controller may be configured to transmit, to the laser device, a trigger signal that gives a trigger to the laser device to output the laser light. The droplet detector may transmit, to the controller, a pass timing signal that indicates a timing when the droplet passes through the detection region. The controller may include a noise compensation unit configured to compensate for noise that is caused by an electromagnetic wave radiated from the plasma and superimposed on the pass timing signal. The controller may transmit the trigger signal to the laser device based on the pass timing signal in which the noise is compensated for by the noise compensation unit.

BRIEF DESCRIPTION OF THE DRAWINGS

Some embodiments of the present disclosure will be described below as just examples with reference to the accompanying drawings.

FIG. 10 is a diagram for explaining an example of specifically calculating a velocity correction amount of a droplet with use of a function of correcting the velocity of the droplet that is an aspect of the noise isolation function;

FIG. 18 is a diagram for explaining a noise isolation function of the noise compensation unit according to the third embodiment;

EMBODIMENTS

Figure 1:
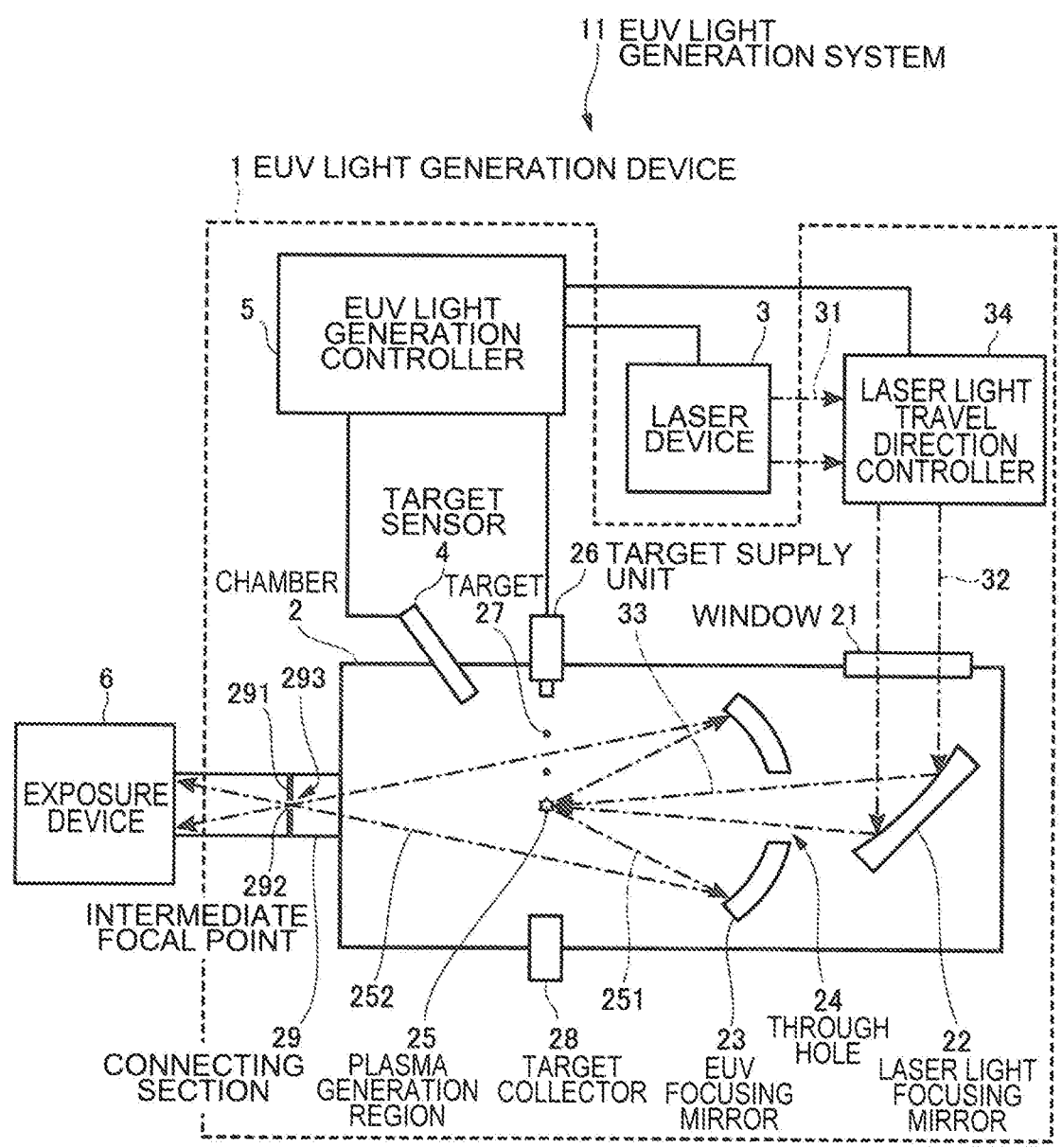
FIG. 1 is a diagram schematically illustrating a configuration of an exemplary LPP type EUV light generation system.

Contents
1. Overall description of EUV light generation system
   1.1 Configuration
   1.2 Operation
2. Terms
3. Problem
   3.1 Configuration of comparative example
   3.2 Operation of comparative example
   3.3 Problem
4. First Embodiment
   4.1 Configuration
      4.1.1 Noise determination function
      4.1.2 Noise isolation function
      4.1.3 Noise masking function
      4.1.4 Delay time correction function
   4.2 Operation
   4.3 Effect
5. Second Embodiment
   5.1 Configuration and operation
   5.2 Effect
6. Third Embodiment
   6.1 Configuration
   6.2 Operation
   6.3 Effect
7. Fourth Embodiment
   7.1 Configuration and operation
   7.2 Effect
8. Fifth Embodiment
   8.1 Configuration and operation
   8.2 Effect
9. Sixth Embodiment
   9.1 Configuration and operation
   9.2 Effect
10. Others
   10.1 Hardware environment of each controller
   10.2 Other modifications and the like Hereinafter, embodiments of the present disclosure will be described in detail with reference to the drawings. The embodiments described below illustrate some examples of the present disclosure and do not limit the contents of the present disclosure. All of the configurations and the operations described in the embodiments are not always indispensable as configurations and operations of the present disclosure. It should be noted that the same constituent elements are denoted by the same reference numerals, and overlapping description is omitted.

1. Overall Description of EUV Light Generation System

[1.1 Configuration]

FIG. 1 schematically illustrates a configuration of an exemplary LPP type EUV light generation system.

An EUV light generation device 1 may be used together with at least one laser device 3. In the present application, a system including the EUV light generation device 1 and the laser device 3 is called an EUV light generation system 11. As illustrated in FIG. 1 and as described below in detail, the EUV light generation device 1 may include a chamber 2 and a target supply unit 26. The chamber 2 may be sealable. The target supply unit 26 may be provided in such a manner as to penetrate a wall of the chamber 2, for example. The material of a target 27 supplied from the target supply unit 26 may include, but not limited to, tin, terbium, gadolinium, lithium, xenon, or a combination of any two or more of them.

A wall of the chamber 2 may be provided with at least one through hole. The through hole may be provided with a window 21. Pulse laser light 32 output from the laser device 3 may pass through the window 21. Inside the chamber 2, an EUV focusing mirror 23 having a spheroidal reflection surface, for example, may be disposed. The EUV focusing mirror 23 may have first and second focal points. On the surface of the EUV focusing mirror 23, a multilayer reflection film in which molybdenum and silicon are alternately layered, for example, may be formed. It is preferable that the EUV focusing mirror 23 is disposed such that the first focal point locates in the plasma generation region 25 and the second focal point locates at an intermediate focal point (IF) 292, for example. The EUV focusing mirror 23 may have a through hole 24 in the center portion thereof, and the pulse laser light 33 may pass through the through hole 24.

The EUV light generation device 1 may include an EUV light generation controller 5, a target sensor 4, and the like. The target sensor 4 may have an image capturing function, and may be configured to detect presence, trajectory, position, velocity, and the like of the target 27.

The EUV light generation device 1 may also include a connecting section 29 configured to communicate the inside of the chamber 2 and an inside of an exposure device 6 with each other. In the connecting section 29, a wall 291 having an aperture 293 may be provided. The wall 291 may be disposed such that the aperture 293 locates at a second focal point position of the EUV focusing mirror 23.

Moreover, the EUV light generation device 1 may include a laser light travel direction controller 34, a laser light focusing mirror 22, a target collector 28 configured to collect the target 27, and the like. The laser light travel direction controller 34 may have an optical element configured to define the travel direction of the laser light, and an actuator configured to regulate the position, posture, and the like of the optical element.

[1.2 Operation]

Referring to FIG. 1, the pulse laser light 31 output from the laser device 3 may pass through the laser light travel direction controller 34 and pass through the window 21 as pulse laser light 32 to enter the chamber 2. The pulse laser light 32 may travel inside the chamber 2 along at least one laser light path, and may be reflected by the laser light focusing mirror 22 and radiated as the pulse laser light 33 to at least one target 27.

The target supply unit 26 may be configured to output the target 27 toward the plasma generation region 25 in the chamber 2. The target 27 may be irradiated with at least one pulse included in the pulse laser light 33. The target 27 irradiated with the pulse laser light 33 is made into plasma, and from the plasma, EUV light 251 may be radiated along with radiation of light having a different wavelength. The EUV light 251 may be reflected selectively by the EUV focusing mirror 23. The EUV light 252 reflected by the EUV focusing mirror 23 may be focused at the intermediate focal point 292 and output to the exposure device 6. One target 27 may be irradiated with a plurality of pulses included in the pulse laser light 33.

The EUV light generation controller 5 may be configured to integrate control of the entire EUV light generation system 11. The EUV light generation controller 5 may be configured to process image data or the like of the target 27 captured by the target sensor 4. Further, the EUV light generation controller 5 may perform at least one of control of the timing when the target 27 is output and control of the target 27 output direction or the like, for example. Furthermore, the EUV light generation controller 5 may perform at least one of control of the output timing of the laser device 3, control of the travel direction of the pulse laser light 32, and control of the light focusing position of the pulse laser light 33, for example. The various types of control described above are merely examples, and another type of control can be added when necessary.

2. Terms

"Target" is an object to be irradiated with laser light introduced into the chamber. A target irradiated with laser light is made into plasma and radiates EUV light.

"Droplet" is a mode of a target to be supplied to the chamber.

"Plasma generation region" is a predetermined region in the chamber. The plasma generation region is a region where a droplet output into the chamber is irradiated with laser light, and the target is made into plasma.

"Droplet trajectory" is a path on which a droplet output into the chamber travels. The droplet trajectory may intersect with an optical path of laser light introduced into the chamber in a plasma generation region.

"Optical path axis" is an axis passing through a center of a beam cross section of laser light along the travel direction of the laser light.

"Optical path" is a path through which laser light passes. The optical path may include an optical path axis.

"Z axis direction" is a direction in which the EUV light generation device outputs EUV light. This means that the Z axis direction is a direction in which EUV light is output from the chamber of the EUV light generation device to the exposure device.

"Y axis direction" is a direction in which the target supply unit outputs a target into the chamber.

"X axis direction" is a direction orthogonal to the Y axis direction and the Z axis direction.

3. Problem

An EUV light generation device 1 of a comparative example will be described with use of FIGS. 2 to 5.

The EUV light generation device 1 of the comparative example may include a droplet detector 41.

[3.1 Configuration of Comparative Example]

Figure 2:
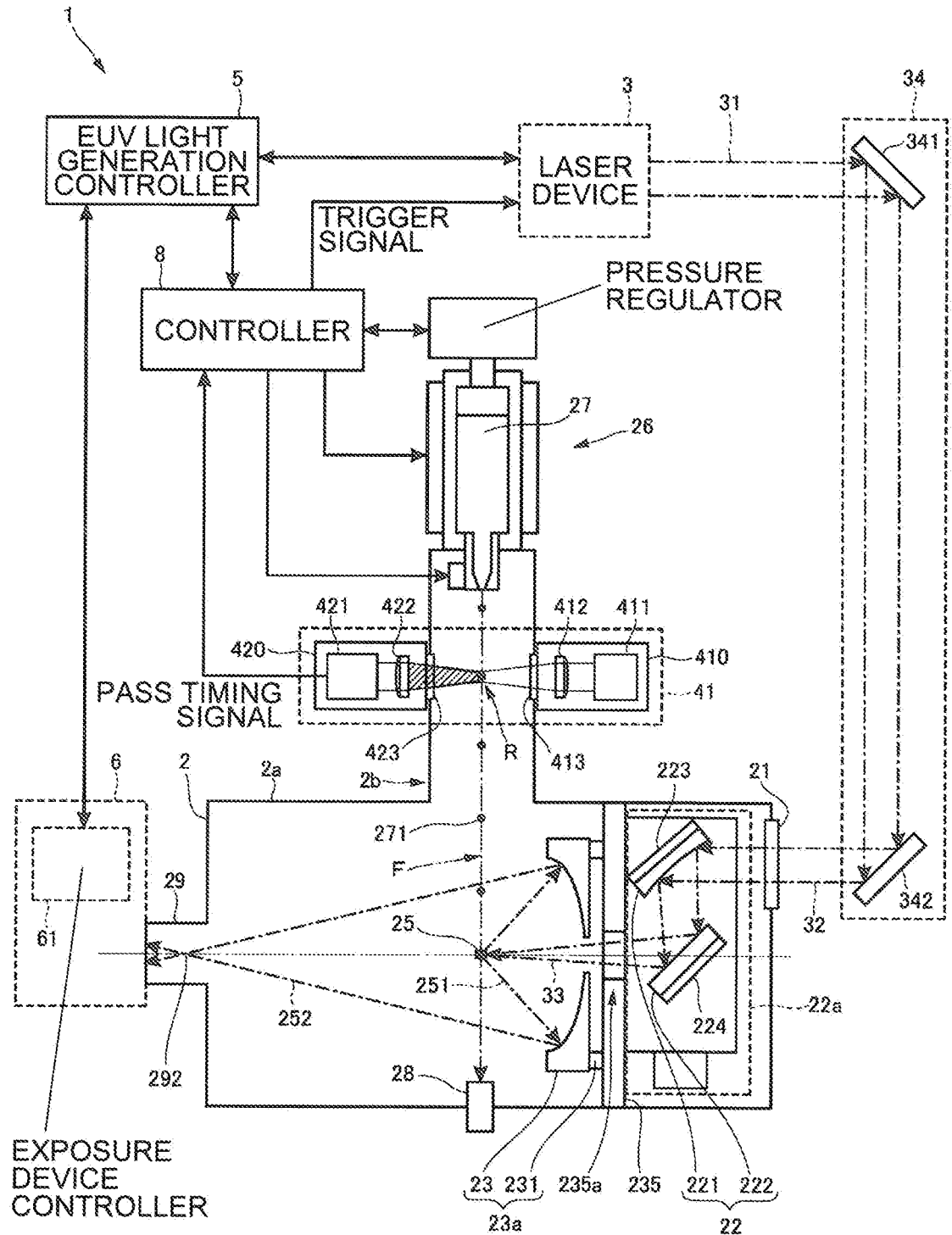
FIG. 2 is a diagram for explaining a configuration of an EUV light generation device of a comparative example.
Figure 3:
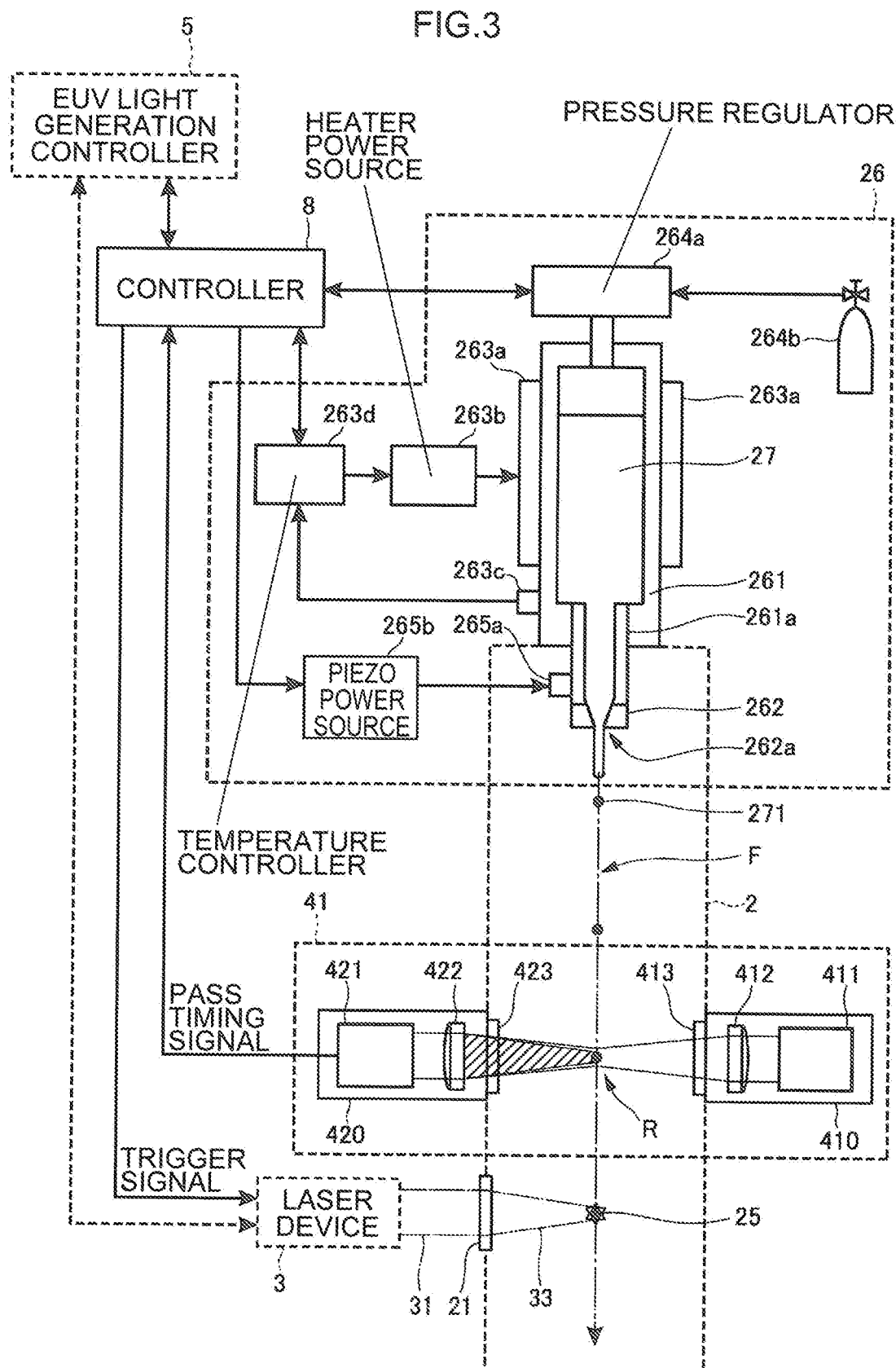
FIG. 3 is a diagram for explaining configurations of a target supply unit and a droplet detector of the comparative example.

FIG. 2 is a diagram for explaining a configuration of the EUV light generation device 1 of the comparative example. FIG. 3 is a diagram for explaining configurations of a target supply unit 26 and the droplet detector 41 of the comparative example.

The EUV light generation device 1 of the comparative example may be a device used together with a laser device 3 configured to output pulse laser light 31.

The EUV light generation device 1 of the comparative example may include a chamber 2, the target supply unit 26, a target collector 28, the droplet detector 41, an EUV light generation controller 5, and a controller 8.

The chamber 2 may be a container in which a droplet 271, supplied therein by the target supply unit 26, is irradiated with pulse laser light 33 whereby EUV light 252 is generated, as described above. The chamber 2 may isolate an inner space to be decompressed for generating the EUV light 252 from externality.

The chamber 2 may be formed in a hollow cylindrical shape, for example.

The center axis direction of the cylindrical chamber 2 may be substantially parallel to the direction of outputting the EUV light 252 to the exposure device 6.

A wall 2a forming the inner space of the chamber 2 may be made of a material having electrical conductivity.

The chamber 2 may include a target supplying path 2b configured to supply the droplet 271 from the outside of the chamber 2 to the inside of the chamber 2.

The target supplying path 2b may be provided on a lateral face part of the cylindrical chamber 2.

The target supplying path 2b may be formed in a cylindrical shape.

The center axis direction of the cylindrical target supplying path 2b is substantially orthogonal to the direction of outputting the EUV light 252 to the exposure device 6.

The chamber 2 may be provided, at the inside thereof, with a laser light focusing optical system 22a, an EUV focusing optical system 23a, a target collector 28, and a plate 235.

The plate 235 may divide the inner space of the chamber 2.

The plate 235 may be fixed on the inner lateral surface of the chamber 2.

The center of the plate 235 may have a hole 235a through which the pulse laser light 33 can pass in the thickness direction thereof. The opening direction of the hole 235a may be substantially the same as that of an axis passing through the through hole 24 and the plasma generation region 25 in FIG. 1.

An inner space of the chamber 2 divided on the side of a connecting section 29 from the plate 235 may be provided with an EUV focusing optical system 23a.

An inner space of the chamber 2 divided on the side of a window 21 from the plate 235 may be provided with a laser light focusing optical system 22a.

The EUV focusing optical system 23a may include an EUV focusing mirror 23 and a holder 231.

The EUV focusing mirror 23 may be held by the holder 231. The holder 231 may be fixed to the plate 235.

The laser light focusing optical system 22a may include a laser light focusing mirror 22, a holder 223, and a holder 224.

The laser light focusing mirror 22 may be disposed such that pulse laser light 32 passing through a window 21 provided on the bottom face of the chamber 2 is made incident.

The laser light focusing mirror 22 may include an off-axis parabolic mirror 221 and a plane mirror 222.

The off-axis parabolic mirror 221 may be disposed to face the window 21 provided on the bottom face of the chamber 2 and the plane mirror 222, respectively. The off-axis parabolic mirror 221 may be held by a holder 223.

The plane mirror 222 may be disposed to face the hole 235a and the off-axis parabolic mirror 221, respectively. The plane mirror 222 may be held by a holder 224.

The holder 223 and the holder 224 may be fixed to a triaxial stage not illustrated. The triaxial stage may include an actuator for moving the holder 223 and the holder 224 in three axial directions, namely the X axis direction, the Y axis direction, and the Z axis direction. The operation of the actuator of the triaxial stage may be controlled by the EUV light generation controller 5.

The positions and the posture of the off-axis parabolic mirror 221 and the plane mirror 222 may be adjusted by the EUV light generation controller 5 controlling the actuator of the triaxial stage. Such an adjustment can be made such that the pulse laser light 33, emitted from the laser light focusing mirror 22, is focused on the plasma generation region 25.

The target collector 28 may be a device configured to collect the droplet 271 not irradiated with the pulse laser light 33, among the droplets 271 output into the chamber 2.

The target collector 28 may be disposed on the extended line of a droplet trajectory F.

A laser light travel direction controller 34 may control the travel direction of the pulse laser light 31 such that the pulse laser light 31 output from the laser device 3 is made incident on the window 21 of the chamber 2 as pulse laser light 32.

The laser light travel direction controller 34 may include a high reflective mirror 341 and a high reflective mirror 342.

The positions and the posture of the high reflective mirror 341 and the high reflective mirror 342 may be adjusted by an actuator not illustrated. Operation of the actuator may be controlled by the EUV light generation controller 5.

The positions and the posture of the high reflective mirror 341 and the high reflective mirror 342 may be adjusted along with control of the actuator by the EUV light generation controller 5. Such an adjustment may be made such that the pulse laser light 32, emitted from the laser light travel direction controller 34, passes through the window 21 provided on the bottom face of the chamber 2.

The EUV light generation controller 5 may transmit and receive various types of signals to and from an exposure device controller 61 provided to the exposure device 6.

For example, the EUV light generation controller 5 may receive, from the exposure device controller 61, an EUV light output command signal representing a control command related to output of the EUV light 252 to the exposure device 6. The EUV light output command signal may include various types of target values such as a target output timing, a target repetition frequency, and target pulse energy of the EUV light 252.

The EUV light generation controller 5 may integrally control the operation of the respective constituent elements of an EUV light generation system 11, based on the various types of signals from the exposure device controller 61.

The EUV light generation controller 5 may transmit and receive a control signal to and from the laser device 3. Thereby, the EUV light generation controller 5 may control operation of the laser device 3.

The EUV light generation controller 5 may transmit and receive control signals to and from respective actuators that operate the laser light travel direction controller 34 and the laser light focusing optical system 22a. Thereby, the EUV light generation controller 5 may regulate the traveling directions and the light focusing positions of beams of the pulse laser light 31 to 33.

The EUV light generation controller 5 may transmit and receive a control signal to and from the controller 8. Thereby, the EUV light generation controller 5 may indirectly control operation of the respective constituent elements included in the target supply unit 26 and the droplet detector 41.

The target supply unit 26 may be a device configured to melt the target 27 to be supplied into the chamber 2, and output it as the droplet 271 to the plasma generation region 25 in the chamber 2. The target supply unit 26 may be a device that outputs the droplet 271 in a so-called continuous jet method.

The material of the target 27 supplied by the target supply unit 26 may be a metallic material. The metallic material of the target 27 may include, but not limited to, tin, terbium, gadolinium, lithium, or a combination of any two or more of them. Preferably, the metallic material of the target 27 may be tin.

The target supply unit 26 may be provided to an end portion of the target supplying path 2b of the chamber 2.

As illustrated in FIG. 3, the target supply unit 26 may include a tank 261 and a nozzle 262. Further, the target supply unit 26 may also include a heater 263a, a heater power source 263b, a temperature sensor 263c, a temperature controller 263d, a pressure regulator 264a, a gas cylinder 264b, a piezo element 265a, and a piezo power source 265b.

The tank 261 may be a container for storing the target 27 to be output into the chamber 2. The tank 261 may contain the target 27 therein in a molten state.

The tank 261 may be formed in a hollow cylindrical shape.

The tank 261 may be made of a material that resists chemical reaction with the target 27. The material that resists chemical reaction with the target 27 may be at least one of SiC, SiO$_2$, Al$_2$O$_3$, molybdenum, tungsten, and tantalum, for example.

The tank 261 may be disposed outside of an end portion of the target supplying path 2b of the chamber 2.

The tank 261 may be disposed such that the center axis thereof substantially coincides with the droplet trajectory F.

The nozzle 262 may be a member configured to output the target 27 stored in the tank 261 into the chamber 2.

The nozzle 262 may be formed in a plate shape.

The nozzle 262 may be made of a material that resists chemical reaction with the target 27.

The nozzle 262 may be connected with the tank 261. The nozzle 262 may be connected with the tip of a neck portion 261a that is an end portion on the plasma generation region 25 side of the tank 261.

The nozzle 262 may have a nozzle hole 262a at the center thereof.

The nozzle hole 262a may be formed to penetrate the nozzle 262. The nozzle hole 262a may be formed such that the center axis thereof substantially coincides with the droplet trajectory F. The nozzle hole 262a may be formed in a shape such that the molten target 27 is jetted to the inside of the chamber 2.

In the chamber 2 including the tank 261, the nozzle 262, and the target supplying path 2b, the insides thereof may communicate with each other.

The heater 263a may heat the tank 261.

The heater 263a may be connected with the tank 261. The heater 263a may be disposed to cover the outer surface of the tank 261.

The heater 263a may be connected with the heater power source 263b.

The heater power source 263b may be a power source for supplying electric power to the heater 263a.

The heater power source 263b may be connected with the temperature controller 263d. Operation of the heater power source 263b may be controlled by the temperature controller 263d.

The temperature sensor 263c may be a sensor configured to detect the temperature of the tank 261.

The temperature sensor 263c may be connected with the outer surface of the tank 261 in the vicinity of the neck portion 261a.

The temperature sensor 263c may be connected with the temperature controller 263d. The temperature sensor 263c may transmit a temperature detection signal corresponding to the detected temperature of the tank 261, to the temperature controller 263d.

The temperature controller 263d may be a controller configured to control the temperature of the tank 261.

The temperature controller 263d may be connected with the controller 8. The temperature controller 263d may control the temperature of the tank 261 based on a command from the controller 8.

The pressure regulator 264a may regulate the pressure applied to the target 27 in the tank 261.

The pressure regulator 264a may be connected to the inside of the tank 261.

The pressure regulator 264a may be connected to a gas cylinder 264b. The gas cylinder 264b may be filled with inert gas such as helium or argon. The pressure regulator 264a may supply the inert gas in the gas cylinder 264b into the tank 261.

The pressure regulator 264a may have an exhaust port not illustrated. The pressure regulator 264a may exhaust the gas in the tank 261 from the exhaust port.

The pressure regulator 264a may regulate the pressure applied to the target 27 in the tank 261 by supplying gas to the tank 261 or exhausting the gas in the tank 261. Operation of the pressure regulator 264a may be controlled by the controller 8.

The piezo element 265a may vibrate the neck portion 261a of the tank 261.

The piezo element 265a may be connected with the outer surface of the neck portion 261a in the vicinity of the nozzle 262.

The piezo element 265a may be connected with the piezo power source 265b.

The piezo power source 265b may be a power source for supplying electric power to the piezo element 265a.

The piezo power source 265b may be connected with the controller 8. Operation of the piezo power source 265b may be controlled by the controller 8.

The droplet detector 41 may be a sensor that detects the droplet 271 output into the chamber 2.

Specifically, the droplet detector 41 may be a sensor configured to detect a timing when the droplet 271 passes through a detection region R located at a predetermined position in the chamber 2. The predetermined region where the detection region R is located may be on the droplet trajectory F between the nozzle 262 of the target supply unit 26 and the plasma generation region 25.

As illustrated in FIG. 3, the droplet detector 41 may include a light source unit 410 and a light receiving unit 420.

The light source unit 410 and the light receiving unit 420 may be connected with the outside of a wall 2a of the chamber 2. They may be connected with the wall 2a of the target supplying path 2b that is a part of the chamber 2.

The light source unit 410 and the light receiving unit 420 may be disposed to face each other over the detection region R on the droplet trajectory F.

The facing direction of the light source unit 410 and the light receiving unit 420 may be substantially orthogonal to the droplet trajectory F.

The light source unit 410 may output illumination light to the detection region R in the chamber 2. The illumination light output from the light source unit 410 may radiate the droplet 271 passing through the detection region R.

The light source unit 410 may include a light source 411, an illumination optical system 412, and a window 413.

The light source 411 may be a light source of the illumination light output to the detection region R via the window 413.

The light source 411 may be a light source such as CW (Continuous Wave) laser that outputs single-wavelength continuous laser light, for example. Alternatively, the light source 411 may be a light source such as a lamp that outputs continuous light having multiple wavelengths.

Operation of the light source 411 may be controlled by the controller 8.

The illumination optical system 412 may be an optical system including a light focusing lens and the like. The light focusing lens may be a cylindrical lens, for example.

The illumination optical system 412 may be disposed on the optical path of the illumination light output from the light source 411.

The illumination optical system 412 may transmit the illumination light output from the light source 411 to guide it to the window 413. The illumination optical system 412 may focus the illumination light output from the light source 411 on the detection region R via the window 413.

The window 413 may be provided to the wall 2a of the target supplying path 2b that is a part of the chamber 2.

The window 413 may be disposed on the optical path of the illumination light that passed through the illumination optical system 412.

The window 413 may transmit the illumination light that passed through the illumination optical system 412 toward the detection region R.

The light receiving unit 420 may receive illumination light output from the light source unit 410 to the detection region R.

The light receiving unit 420 may include an optical sensor 421, a light receiving optical system 422, and a window 423.

The window 423 may be provided to the wall 2a of the target supplying path 2b that is a part of the chamber 2.

The window 423 may be disposed facing the window 413 of the light source unit 410 over the detection region R.

The window 423 may be disposed on the optical path of the illumination light output to the detection region R.

The window 423 may transmit the illumination light, output to the detection region R, toward the light receiving optical system 422.

The light receiving optical system 422 may be an optical system such as a collimator, and may be configured of an optical element such as a lens.

The light receiving optical system 422 may be disposed on the optical path of the illumination light output to the detection region R and passed through the window 423.

The light receiving optical system 422 may transmit the illumination light that passed through the window 423, and guide it to the optical sensor 421.

The optical sensor 421 may be a light receiving element configured to receive the illumination light output to the detection region R.

The optical sensor 421 may be at least one light receiving element among a photodiode, a photodiode array, an avalanche diode, a photo multiplier, and a multi-pixel photon counter. The optical sensor 421 may be configured by combining such a light receiving element and a high-speed shutter such as an image intensifier.

The optical sensor 421 may be disposed on the optical path of the illumination light passing through the light receiving optical system 422.

The optical sensor 421 may receive the illumination light that passed through the light receiving optical system 422, and detect the light intensity thereof.

The optical sensor 421 may be connected with the controller 8. The optical sensor 421 may transmit a detection signal corresponding to the light intensity of the received illumination light, to the controller 8.

The controller 8 may transmit and receive various types of signals to and from the EUV light generation controller 5.

For example, the controller 8 may receive, from the EUV light generation controller 5, a target output signal representing a control command related to output of the droplet 271 into the chamber 2. The target output signal may be a signal for controlling operation of the target supply unit 26 such that the droplet 271 is output according to various types of target values included in the EUV light output command signal.

The controller 8 may control operation of the respective constituent elements included in the target supply unit 26, based on the various types of signals from the EUV light generation controller 5.

The controller 8 may also control the timing of outputting the pulse laser light 31 by the laser device 3, based on the various types of signals from the EUV light generation controller 5.

[3.2 Operation of Comparative Example]

Overview of the operation of the EUV light generation device 1 of the comparative example will be described with use of FIG. 4.

Figure 4:
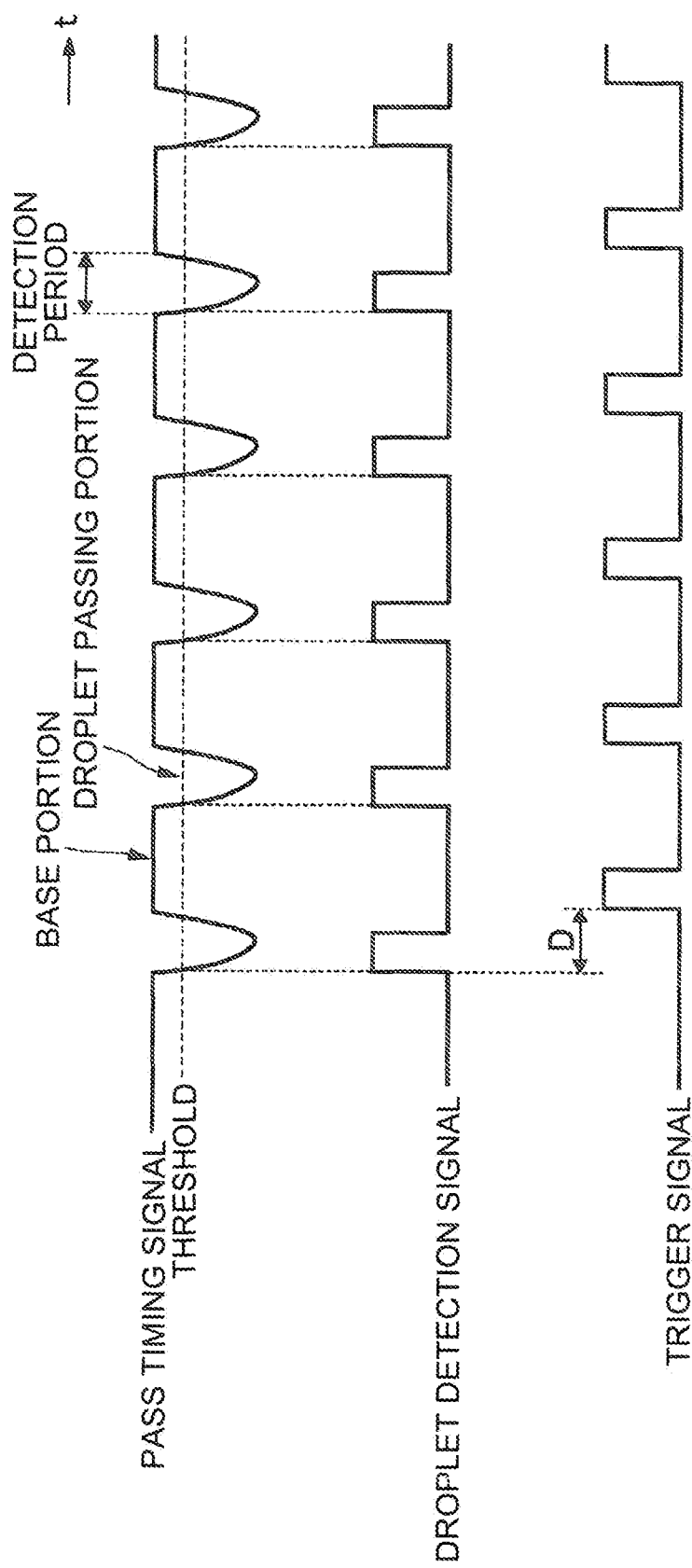
FIG. 4 is a chart for explaining an output timing of a laser device controlled by a controller.

FIG. 4 is a diagram for explaining the output timing of the laser device 3 controlled by the controller 8.

The controller 8 may determine whether or not it receives a target output signal from the EUV light generation controller 5.

When receiving a target output signal, the controller 8 may perform processing as described below until it receives a target output stop signal from the EUV light generation controller 5.

The target output stop signal may be a signal representing a control command to cause the target supply unit 26 to stop supplying of the target 27 into the chamber 2.

The controller 8 may transmit a signal designating the target temperature of the tank 261, to the temperature controller 263*d*.

The temperature sensor 263*c* may transmit a temperature detection signal corresponding to the detected temperature of the tank 261, to the temperature controller 263*d*.

The temperature controller 263*d* may control operation of the heater power source 263*b* configured to supply electric power to the heater 263*a* such that the detected value shown in the temperature detection signal approaches the target temperature.

The target temperature may be a temperature that is within a predetermined range and equal to or higher than the melting point of the target 27. When the target 27 is tin, the target temperature may be a temperature within a range from 250° C. to 290° C.

The controller 8 may continuously control the operation of the heater power source 263*b* via the temperature controller 263*d* such that the temperature inside the tank 261 is maintained within a predetermined range equal to or higher than the melting point of the target 27.

The controller 8 may control operation of the pressure regulator 264*a* such that the pressure applied to the target 27 in the tank 261 becomes a target pressure.

The target pressure may be a pressure with which the target 27 in the tank 261 is jetted from the nozzle hole 262*a* at a predetermined velocity. The predetermined velocity may be in a range from 50 m/s to 100 m/s, for example.

The controller 8 may control operation of the piezo power source 265*b* configured to supply electric power to the piezo element 265*a* such that the piezo element 265*a* vibrates the neck portion 261*a* with a predetermined waveform.

The predetermined waveform may be a waveform with which the droplet 271 is generated as a predetermined frequency. The predetermined frequency may be in a range from 50 kHz to 100 kHz, for example.

The piezo element 265*a* may vibrate the neck portion 261*a* with a predetermined waveform in response to the electric power of a predetermined waveform supplied from the piezo power source 265*b*. The nozzle 262 connected with the neck portion 261*a* may also be vibrated with a predetermined waveform. Thereby, a standing wave is applied to the jet-like target 27 jetted from the nozzle hole 262*a*, and the jet-like target 27 may be separated cyclically. The separated target 27 may form a free interface by the own surface tension to form the droplet 271. As a result, the droplet 271 may be formed at a predetermined frequency and may be output into the chamber 2.

The droplet 271 output into the chamber 2 may travel on the droplet trajectory F and pass through the detection region R.

The light source 411 included in the droplet detector 41 may output the illumination light to the detection region R in the chamber 2. The optical sensor 421 included in the droplet detector 41 may receive the illumination light output from the light source 411.

In the case where the droplet 271 travelling on the droplet trajectory F passes through the detection region R, the illumination light output from the light source 411 may illuminate the droplet 271 passing through the detection region R, and travel toward the optical sensor 421. At that time, part of the illumination light traveling toward the optical sensor 421 may be shielded by the droplet 271.

As such, when the droplet 271 passes through the detection region R, a part of an image in the detection region R of the illumination light, output from the light source 411, may be received by the optical sensor 421 as a shadow image of the droplet 271 passing through the detection region R.

Accordingly, when the droplet 271 passes through the detection region R, the light intensity of the illumination light received by the optical sensor 421 may be reduced significantly compared with the case where the droplet 271 does not pass through the detection region R.

The optical sensor 421 may convert the light intensity of the received illumination light into a voltage value to generate a detection signal corresponding to a change in the light intensity, and transmit it to the controller 8.

The light intensity of the illumination light received by the optical sensor 421 is also referred to as light receiving intensity of the optical sensor 421.

A detection signal corresponding to a change in the light receiving intensity generated by the optical sensor 421 is also referred to as a pass timing signal.

The pass timing signal may represent a predetermined base voltage, before the droplet 271 enters the detection region R. The pass timing signal may be changed in such a manner that it falls when the droplet 271 enters the detection region R and shows a minimum value when the droplet 271 travels to the center of the detection region R. The pass timing signal may be changed in such a manner that it rises when the droplet 271 that traveled to the center of the detection region R further travels to the plasma generation region 25 side, and returns to the base voltage when the droplet 271 leaves the detection region R.

This means that the pass timing signal may have a signal waveform including an extreme value within a period from the time when the droplet 271 enters the detection region R until the time when it leaves the detection region R.

The period from the time when the droplet 271 enters the detection region R until the time when it leaves the detection region R is also called a detection period.

A portion of the pass timing signal, in which the voltage varies due to passing of the droplet 271 through the detection region R, is also called a droplet passing portion. The droplet passing portion may be a pass timing signal shown within the detection period.

In the pass timing signal, a portion of the base voltage shown when the droplet 271 is not passing through the detection region R is also called a base portion. The base portion may be a pass timing signal shown outside of the detection period.

The controller 8 may receive the pass timing signal from the optical sensor 421.

When the pass timing signal becomes lower than a predetermined threshold, the controller 8 may determine that the droplet 271 passed through the detection region R. This means that the controller 8 may determine the timing when the droplet passing portion of the pass timing signal becomes lower than the predetermined threshold, to be the timing when the droplet 271 passed through the detection region R.

Alternatively, the controller 8 may calculate an intermediate value of the timing when the pass timing signal becomes lower than the predetermined threshold and the timing when the pass timing signal becomes higher than the threshold after showing the extreme value. Then, the controller 8 may determine the timing of the intermediate value to be the timing when the droplet 271 passed through the detection region R.

In either case, the timing when the droplet 271 passes through the detection region R may be determined, by the controller 8, as the timing that is at least in the detection period and that is any timing at least in the droplet passing portion of the pass timing signal.

The predetermined threshold may be set in advance based on a range of voltage values that can be taken by the droplet passing portion of the pass timing signal.

As illustrated in FIG. 4, the controller 8 may generate a droplet detection signal at the timing when the droplet 271 passed through the detection region R.

The droplet detection signal may be a signal representing that the droplet 271 having passed through the detection region R is detected.

As illustrated in FIG. 4, the controller 8 may output a trigger signal to the laser device 3 at the timing delayed by a delay time D from the timing of generating the droplet detection signal.

A trigger signal may be a signal that gives a trigger to the laser device 3 to output the pulse laser light 31.

The delay time D may be a time for making the timing when the pulse laser light 33 reaches the plasma generation region 25 substantially coincide with the timing when the droplet 271 reaches the plasma generation region 25. The delay time D may be stored by the controller 8 in advance.

When receiving the trigger signal, the laser device 3 may output the pulse laser light 31. The pulse laser light 31 output from the laser device 3 may be introduced into the chamber 2 as the pulse laser light 32, via the laser light travel direction controller 34 and the window 21.

The pulse laser light 32 introduced into the chamber 2 may be focused by the laser light focusing optical system 22a, and guided to the plasma generation region 25 as the pulse laser light 33. The pulse laser light 33 may be guided to the plasma generation region 25 at the timing when the droplet 271 reaches the plasma generation region 25.

The droplet 271 that has reached the plasma generation region 25 may be irradiated with pulse laser light 33 guided to the plasma generation region 25. The droplet 271 irradiated with the pulse laser light 33 may be made into plasma and radiate plasma light including EUV light 251.

In this way, the droplet detector 41 may detect the timing when the droplet 271 output into the chamber 2 passed through the detection region R, and transmit a pass timing signal to the controller 8.

Then, the controller 8 may transmit a trigger signal to the laser device 3 in synchronization with a change in the pass timing signal from the droplet detector 41. This means that the controller 8 may control the timing of outputting the pulse laser light 31 from the laser device 3 by transmitting a trigger signal to the laser device 3 based on the pass timing signal.

[3.3 Problem]

Figure 5:
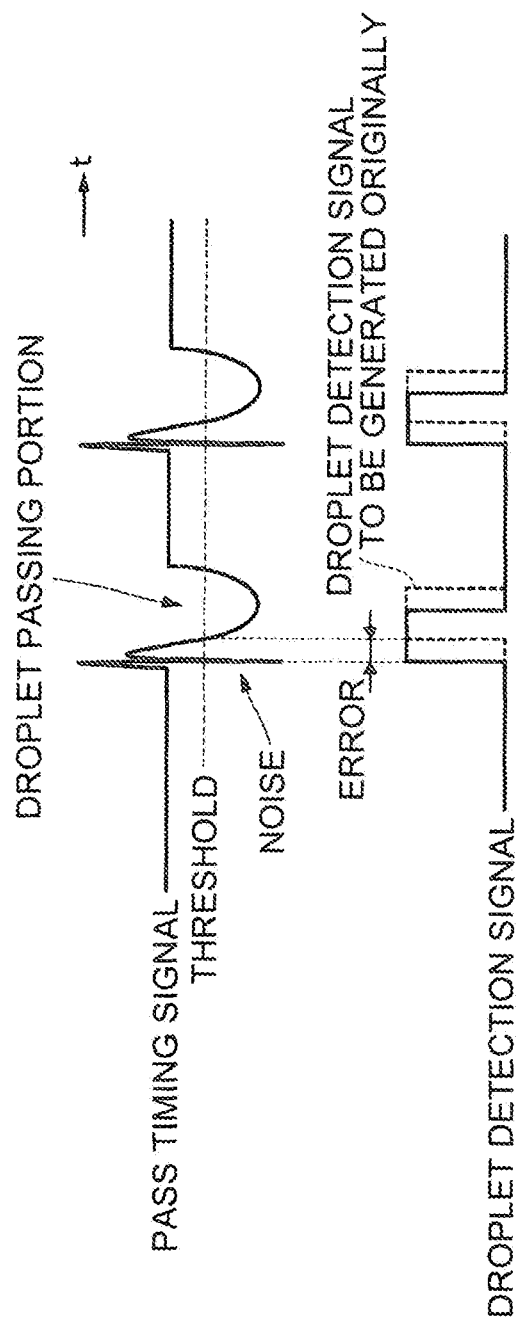
FIG. 5 is a diagram for explaining a problem of the EUV light generation device of the comparative example.

FIG. 5 is a diagram for explaining a problem in the EUV light generation device 1 of the comparative example.

When the droplet 271 that reached the plasma generation region 25 is irradiated with the pulse laser light 33 and plasma is generated, an electromagnetic wave including the EUV light 251 may be radiated from the plasma.

At that time, the electromagnetic wave radiated from the plasma may enter the droplet detector 41 and may be output as noise by the optical sensor 421. The noise may be caused by the electromagnetic wave radiated from the plasma. As illustrated in FIG. 5, the noise may be superimposed on a pass timing signal transmitted from the optical sensor 421.

In that case, the controller 8 may generate a droplet detection signal at the timing when the noise superimposed on the pass timing signal becomes lower than the predetermined threshold as illustrated in FIG. 5, although the droplet 271 did not pass through the detection region R. This means that an error may be caused in the timing of generating the droplet detection signal due to the noise caused by the electromagnetic wave radiated from the plasma.

As such, a trigger signal generated based on the droplet detection signal may be transmitted at wrong timing from the controller 8 to the laser device 3.

Thereby, a gap may be caused between the timing when the droplet 271 reaches the plasma generation region 25 and the timing when the pulse laser light 33 reaches the plasma generation region 25. As a result, the pulse energy of the EUV light 252 output from the EUV light generation device 1 may vary largely among the pulses.

Accordingly, there is a demand on the technology capable of improving the energy stability of the EUV light 252 by generating a droplet detection signal at appropriate timing, even if noise caused by the electromagnetic wave radiated from the plasma is superimposed on the pass timing signal.

The noise caused by the electromagnetic wave radiated from plasma may also be simply referred to as noise.

The timing when the noise caused by the electromagnetic wave radiated from plasma is superimposed on the pass timing signal may also be referred to as noise superimposition timing.

4. First Embodiment

An EUV light generation device 1 of a first embodiment will be described with use of FIGS. 6 to 14.

The EUV light generation device 1 of the first embodiment may have a configuration in which a noise compensation unit 81 is added to the controller 8, with respect to the EUV light generation device 1 of the comparative example.

Regarding the configuration of the EUV light generation device 1 of the first embodiment, description of the configuration that is the same as the configuration of the EUV light generation device 1 of the comparative example is omitted.

[4.1 Configuration]

Figure 6:
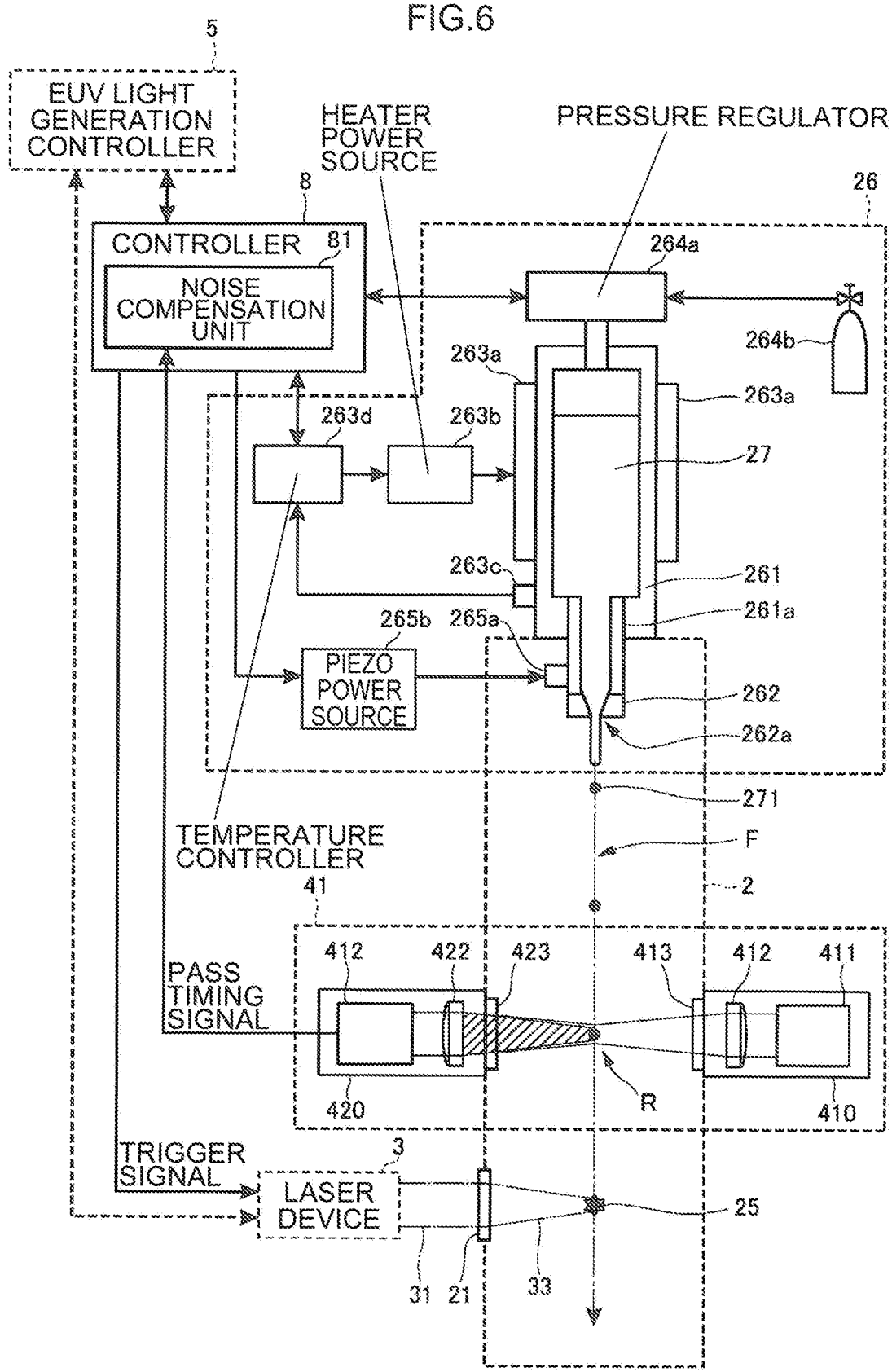
FIG. 6 is a diagram for explaining a configuration of an EUV light generation device according to a first embodiment.

FIG. 6 is a diagram for explaining the configuration of the EUV light generation device 1 of the first embodiment.

The controller 8 of the first embodiment may include the noise compensation unit 81.

The noise compensation unit 81 may receive a pass timing signal from the optical sensor 421 included in the droplet detector 41.

The noise compensation unit 81 may compensate for the noise that is caused by the electromagnetic wave radiated from plasma and is superimposed on the pass timing signal.

Specifically, the noise compensation unit 81 may have a noise determination function of determining whether or not the noise superimposition timing is included in the detection period.

The noise compensation unit 81 may have a noise isolation function of isolating the noise superimposition timing from the detection period.

The noise compensation unit 81 may have a noise masking function of masking the noise superimposed on the pass timing signal at the timing of being isolated from the detection period.

The noise compensation unit 81 may also have a delay time correction function of correcting the delay time D defining the timing when a trigger signal is transmitted from the controller 8.

The various functions of the noise compensation unit 81 may be configured of hardware or software. In the case where such functions of the noise compensation unit 81 are configured of software, information processing by software constituting the various functions of the noise compensation unit 81 can be implemented specifically with use of hardware resources.

[4.1.1 Noise Determination Function]

Figure 7:
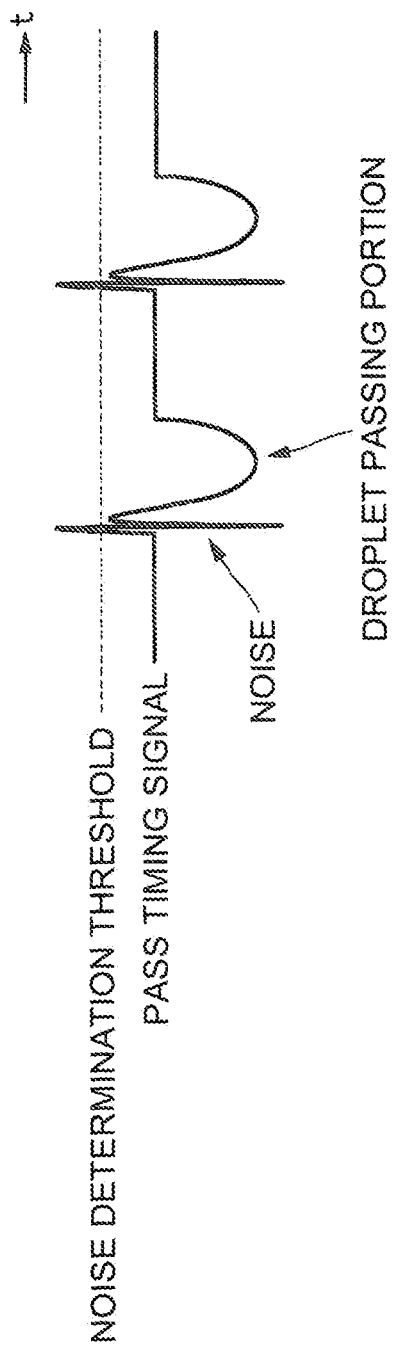
FIG. 7 is a diagram for explaining a noise determination function of a noise compensation unit according to the first embodiment.

FIG. 7 is a diagram for explaining the noise determination function of the noise compensation unit 81 according to the first embodiment.

The noise compensation unit 81 may determine whether or not the noise superimposition timing is included in the detection period, based on the respective signal waveforms of the pass timing signal and the noise.

Specifically, the noise compensation unit 81 may determine whether or not the noise superimposition timing is included in the detection period by determining whether or not the noise is superimposed on the droplet passing portion of the pass timing signal.

In order to realize the noise determination function, the noise compensation unit 81 may be configured as described below, for example.

The noise compensation unit 81 may include a high-speed A/D converter to which a pass timing signal is input, and a digital circuit capable of performing frequency analysis of the pass timing signal.

Then, the noise compensation unit 81 may determine whether or not the noise is superimposed on the droplet passing portion of the pass timing signal, based on the result of frequency analysis performed by the digital circuit.

For example, the noise compensation unit 81 may determine that the noise is not superimposed on the pass timing signal when the frequency components of 1 MHz or lower are dominant in the frequency components of the pass timing signal. The frequency components of 1 MHz or lower in the pass timing signal may represent frequency components corresponding to the base portion and the droplet passing portion of the pass timing signal.

On the other hand, the noise compensation unit 81 may determine that the noise is superimposed on the pass timing signal when there are frequency components between 10 MHz and 20 MHz in the frequency components of the pass timing signal. When the frequency components between 10 MHz and 20 MHz are superimposed on the droplet passing portion of the pass timing signal, the noise compensation unit 81 may determine that the noise superimposition timing is included in the detection period.

Meanwhile, the noise compensation unit 81 may have a noise determination threshold in advance, as illustrated in FIG. 7.

The noise determination threshold may be set as a predetermined value having polarity opposite to the polarity of the droplet passing portion of the pass timing signal.

When the pass timing signal exceeds the noise determination threshold and becomes higher than the noise determination threshold, the noise compensation unit 81 may determine that the noise is superimposed on the pass timing signal. Then, when the noise is superimposed on the droplet passing portion of the pass timing signal, the noise compensation unit 81 may determine that the noise superimposition timing may be included in the detection period.

On the other hand, when the pass timing signal does not exceed the noise determination threshold, the noise compensation unit 81 may determine that the noise caused by the electromagnetic wave radiated from plasma is not superimposed on the pass timing signal.

[4.1.2 Noise Isolation Function]

Figure 8:
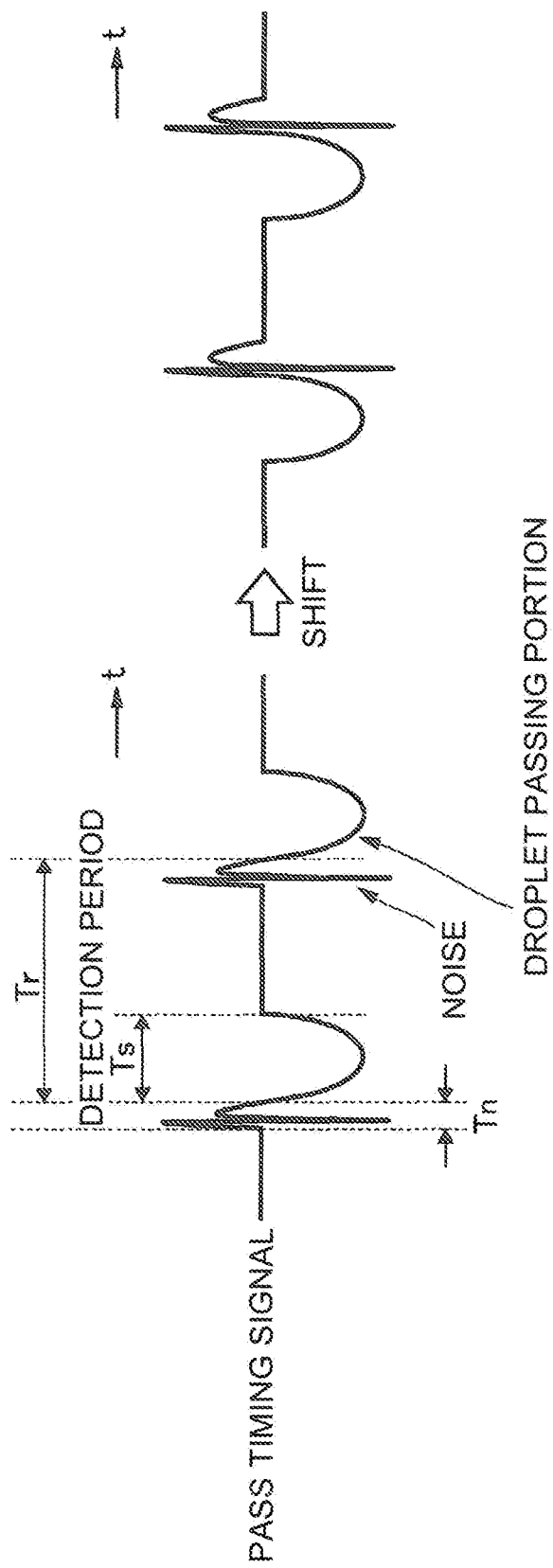
FIG. 8 is a diagram for explaining a noise isolation function of the noise compensation unit according to the first embodiment.
Figure 9:
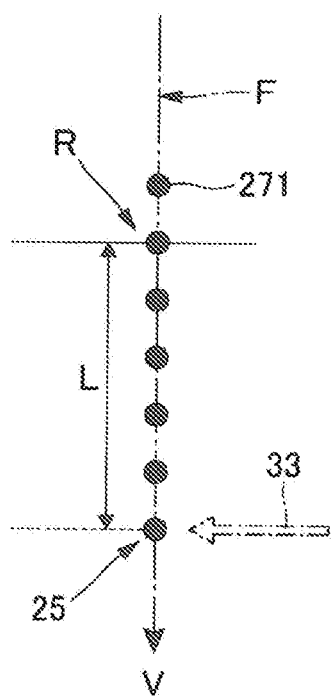
FIG. 9 is a diagram for explaining a function of correcting a velocity of a droplet as an aspect of the noise isolation function.

FIG. 8 is a diagram for explaining the noise isolation function of the noise compensation unit 81 according to the first embodiment. FIG. 9 is a diagram for illustrating a function of correcting the velocity of the droplet 271 as an aspect of the noise isolation function.

When the noise superimposition timing is included in the detection period, the controller 8 may generate a droplet detection signal at wrong timing.

This means that when the noise superimposition timing is not included in the detection period, the noise may be superimposed on the base portion of the pass timing signal. In that case, the noise compensation unit 81 can mask the noise superimposed on the base portion of the pass timing signal relatively easily. However, when the noise superimposition timing is included in the detection period, it may be difficult to mask the noise because the droplet passing portion of the pass timing signal is a relatively short period. In that case, the controller 8 may determine the timing when the droplet 271 passed through the detection region R, based on the noise superimposed on the droplet passing portion of the pass timing signal. In that case, the controller 8 may generate a droplet detection signal at wrong timing.

Accordingly, it may be necessary to isolate the noise superimposition timing from the detection period.

The noise compensation unit 81 may isolate the noise superimposition timing from the detection period.

Specifically, the noise compensation unit 81 may isolate the noise from the droplet passing portion of the pass timing signal to thereby isolate the noise superimposition timing from the detection period.

Here, as illustrated in FIG. 8, the time width of the droplet passing portion of the pass timing signal is represented by Ts (μs). The length of Ts may correspond to the detection period. The time width of noise caused by the electromagnetic wave radiated from plasma and superimposed on the pass timing signal is represented by Tn (μm). A time interval between a droplet passing portion for one droplet 271 and a droplet passing portion for another droplet 271 following the one droplet 271 is represented by Tr (μs). The length of Tr may correspond to the cycle of generating the droplet 271 and may correspond to the repetition cycle of the EUV light 252.

In that case, when the droplet passing portion of the pass timing signal is shifted by at least a time (Ts+Tn), the noise may be isolated from the droplet passing portion of the pass timing signal. This means that when the droplet passing portion of the pass timing signal is shifted by at least the time (Ts+Tn), the noise superimposition timing can be isolated from the detection period.

Further, when the droplet passing portion of the pass timing signal is shifted by Tr or longer, the noise superimposition timing may be included in the detection period.

This means that in order to isolate the noise superimposition timing from the detection period, the droplet passing portion of the pass timing signal should be shifted by a time d (μs) being equal to the time (Ts+Tn) or longer but shorter than Tr.

In other words, in order to isolate the noise superimposition timing from the detection period, the time d by which the droplet passing portion of the pass timing signal should be shifted may be described as following Expression (1):

$$(Ts+Tn) \leq d < Tr \qquad \text{Expression (1)}$$

The time d by which the droplet passing portion of the pass timing signal should be shifted for isolating the noise superimposition timing from the detection period is also referred to as a shift time d.

The noise compensation unit 81 may correct the velocity of the droplet 271 to secure the shift time d. This means that the noise compensation unit 81 may have a function of correcting the velocity of the droplet 271 as an aspect of the noise isolation function.

Here, as illustrated in FIG. 9, the velocity of the droplet 271 is represented by V (m/s). The representative distance from the detection region R to the plasma generation region 25 is represented by L (μm).

The time taken from the time when the droplet 271 passes through the detection region R to the time when it reaches the plasma generation region 25 may be L/V (μs).

In that case, the shift time d may be described as following Expression (2):

$$d = \{L/(V-v)\} - \{L/V\} \qquad \text{Expression (2)}$$

v (m/s) on the right side may be a correction amount at the velocity V of the droplet 271 required for securing the shift time d. (V−v) on the right side may be the velocity of the droplet 271 corrected by the velocity correction amount v.

When Expression (2) is developed on v, the velocity correction amount v of the droplet 271 may be described as following Expression (3):

$$v = dV^2/(dV+L) \qquad \text{Expression (3)}$$

FIG. 10 is a diagram for explaining an example of specifically calculating the velocity correction amount v of the droplet 271 with use of a function of correcting the velocity of the droplet 271 that is an aspect of the noise isolation function.

The velocity V of the droplet 271 is assumed to be 50 m/s.

The diameter of the droplet 271 is assumed to be 20 μm.

The width of the detection region R in the direction along the droplet trajectory F is assumed to be 20 μm.

The repetition frequency of the EUV light 252 is assumed to be 100 kHz. This means that the repetition cycle of the EUV light 252 may be 10 is. The cycle of generating the droplet 271 may be 10 μs. The time interval Tr between the droplet passing portion of a pass timing signal for one droplet 271 and the droplet passing portion of a pass timing signal for the following droplet 271 may be 10 μs.

The distance L from the detection region R to the plasma generation region 25 is assumed to be 2000 μm.

The time width Tn of the noise is assumed to be 0.1 μs. It is known in advance by experiment that Tn is 0.1 μs or shorter smaller.

In that case, the time width Ts of the droplet passing portion of the pass timing signal may be calculated to be 0.8 μs. This means that the detection period may be 0.8 μs.

The lower limit value of the shift time d may be calculated to be 0.9 μs.

The shift time d may be calculated to be 0.9 μs≤d<10 μs, from Expression (1).

Here, it is assumed that the shift time d is set to 3 is.

In that case, the velocity correction amount v of the droplet 271 may be calculated to be 1.1 m/s, from Expression (3).

Accordingly, the velocity V of the droplet 271 corrected with the velocity correction amount v may be calculated to be 48.9 m/s by subtracting 1.1 m/s from 50 m/s.

In this way, the noise compensation unit 81 is able to set the shift time d appropriately and to calculate the velocity correction amount v, when it knows the velocity V and the diameter of the droplet 271, the width of the detection region R, the distance L from the detection region R to the plasma generation region 25, and the time width Tn of the noise.

Meanwhile, the velocity of the droplet 271 may be related to the pressure applied to the target 27 in the tank 261. The velocity correction amount v of the droplet 271 may be related to a pressure correction amount p (MPa) of the pressure applied to the target 27 in the tank 261.

In order to correct the velocity of the droplet 271, the noise compensation unit 81 may correct the pressure applied to the target 27 in the tank 261. This means that in order to realize a function of correcting the velocity of the droplet 271, the noise compensation unit 81 may have a function of correcting the pressure applied to the target 27 in the tank 261.

Figures 11, 12:
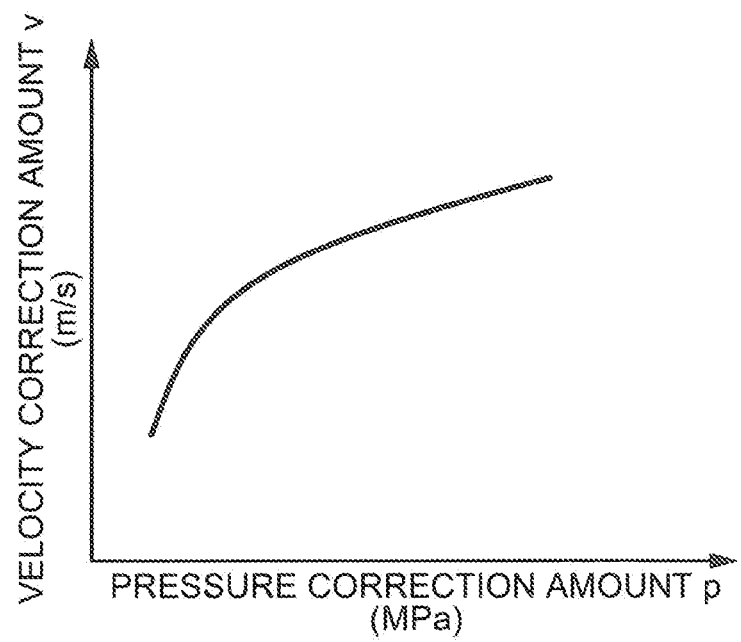
FIG. 11 is a diagram for explaining an approximation formula describing a relationship between the velocity correction amount of the droplet and a pressure correction amount of pressure applied to a target in a tank.
FIG. 12 is a table in which the velocity correction amount of the droplet and the pressure correction amount of pressure applied to the target in the tank are associated with each other.

FIG. 11 is a diagram for explaining an approximation formula describing the relationship between the velocity correction amount v of the droplet 271 and the pressure correction amount p of the pressure applied to the target 27 in the tank 261.

As illustrated in FIG. 11, the velocity correction amount v may increase as the pressure correction amount p increases. The relationship between the velocity correction amount v and the pressure correction amount p may be described as an approximation formula like following Expression (4):

$$p=f(v) \qquad \text{Expression (4)}$$

The noise compensation unit 81 may have an approximation formula like Expression (4) in advance. Then, the noise compensation unit 81 may calculate the pressure correction amount p by substituting the velocity correction amount v, calculated with use of Expression (3), in Expression (4).

Expression (4) describing the relationship between the velocity correction amount v and the pressure correction amount p may be derived in consideration of the diameter of the nozzle hole 262a and the physical property of the target 27, or may be set through experiments or the like in advance.

FIG. 12 is a diagram illustrating a table in which the velocity correction amount v of the droplet 271 and the pressure correction amount p of the pressure applied to the target 27 in the tank 261 are associated with each other.

The noise compensation unit 81 may have a table in advance in which the velocity correction amount v and the pressure correction amount p are associated with each other as illustrated in FIG. 12, instead of an approximation formula like Expression (4). Then, the noise compensation unit 81 may refer to the table illustrated in FIG. 12 to specify the pressure correction amount p associated with the velocity correction amount v calculated with use of Expression (3) described above.

The table in which the velocity correction amount v and the pressure correction amount p are associated with each other may be set in consideration of the diameter of the nozzle hole 262a and the physical property of the target 27, or may be set through experiments or the like in advance.

The noise compensation unit 81 may change the target pressure of the pressure regulator 264a such that the pressure applied to the target 27 in the tank 261 is decreased by the calculated pressure correction amount p.

In this way, the noise compensation unit 81 can correct the velocity of the droplet 271 by correcting the pressure applied to the target 27 in the tank 261. Then, by correcting the velocity of the droplet 271, the noise compensation unit 81 can secure the shift time d.

Thereby, the noise compensation unit 81 can isolate the noise from the droplet passing portion of the pass timing signal to thereby isolate the noise superimposition timing from the detection period.

[4.1.3 Noise Masking Function]

Figure 13:
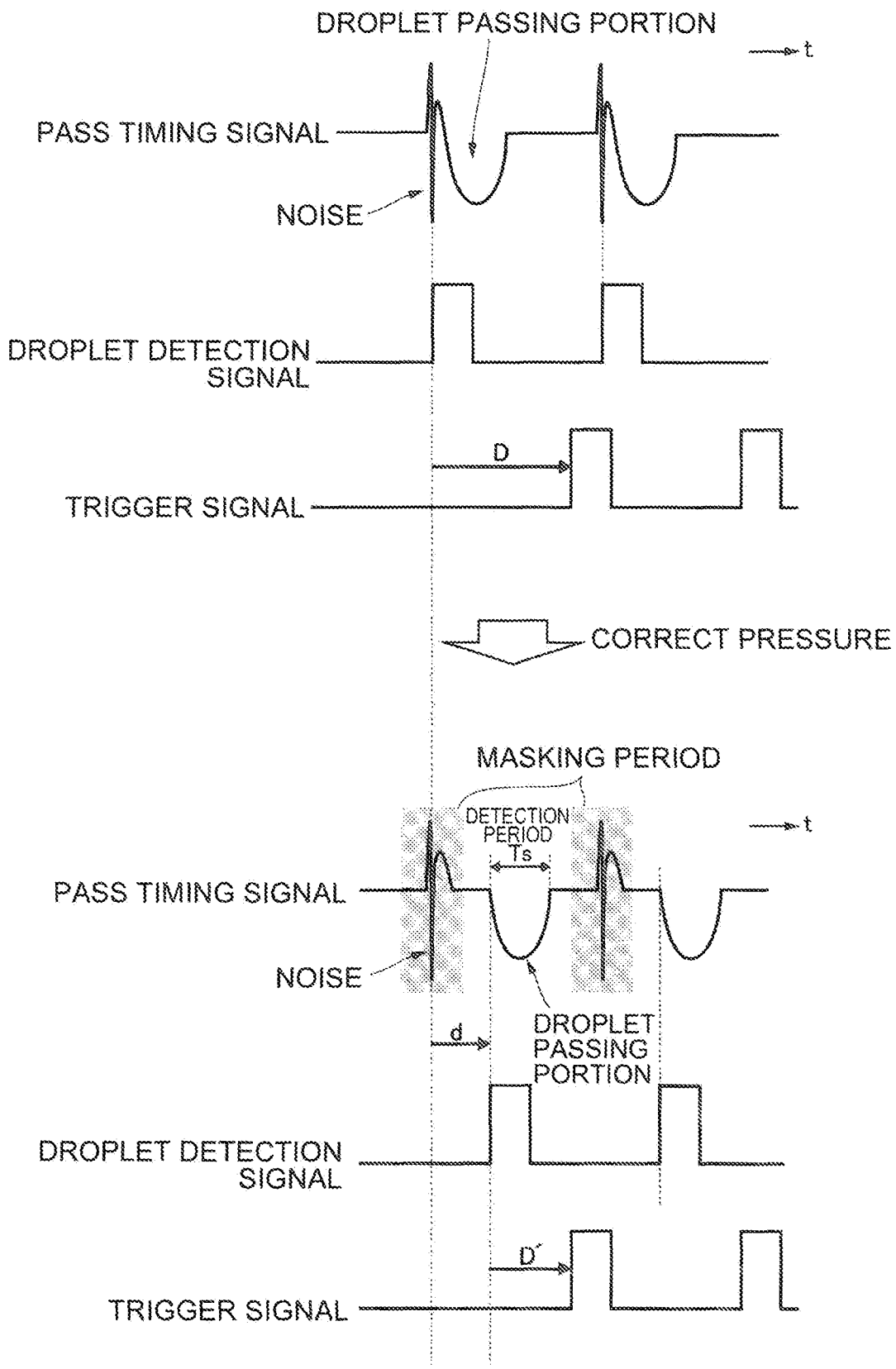
FIG. 13 is a diagram for explaining a noise masking function and a delay time correction function of the noise compensation unit according to the first embodiment.

FIG. 13 is a diagram for explaining the noise masking function and the delay time correction function of the noise compensation unit 81 according to the first embodiment.

The noise compensation unit 81 may mask the noise superimposed on the pass timing signal at the timing of being isolated from the detection period.

Specifically, the noise compensation unit 81 may isolate the noise from the droplet passing portion of the pass timing signal, and mask the noise superimposed on the pass timing signal at the timing of being isolated from the detection period.

The noise compensation unit 81 may have a function of setting a masking period for realizing the noise masking function.

The masking period may be a period within which the noise superimposed on the pass timing signal is masked. The masking period may be a period in which a droplet detection signal and a trigger signal are not generated.

The noise compensation unit 81 may set a period corresponding to the portion not including the droplet passing portion of the pass timing signal, to be the masking period. The noise compensation unit 81 may set a period other than the detection period to be the masking period.

The noise compensation unit 81 may set the masking period based on the timing when the droplet 271 passed through the detection region R. The noise compensation unit 81 may set, as the masking period, a period from the timing when the droplet 271 passed through the detection region R to the timing when detection of the following droplet 271 is expected to be performed.

For example, when the frequency at which the droplet 271 is generated is 20 kHz, the noise compensation unit 81 may set a period from 5 μs to less than 50 μs from the timing when the droplet detection signal is generated as the masking period. For example, when the frequency at which the droplet 271 is generated is 50 kHz, the noise compensation unit 81 may set a period from 2 μs to less than 20 μs from the timing when the droplet detection signal is generated as the masking period. For example, when the frequency at which the droplet 271 is generated is 100 kHz, the noise compensation unit 81 may set a period from 1 μs to less than 10 μs from the timing when the droplet detection signal is generated as the masking period.

[4.1.4 Delay Time Correction Function]

As described above, the delay time D may be the time for allowing the timing when the pulse laser light 33 reaches the plasma generation region 25 to substantially coincide with the timing when the droplet 271 reaches the plasma generation region 25.

When the velocity of the droplet 271 is changed, the timing when the droplet 271 reaches the plasma generation region 25 may be changed. When the velocity of the droplet 271 is corrected by the velocity correction amount v, the timing when the droplet 271 reaches the plasma generation region 25 may be shifted by the shift time d corresponding to the velocity correction amount v.

Thereby, when the velocity of the droplet 271 is corrected by the velocity correction amount v, the noise compensation unit 81 may correct the delay time D, defining the timing when the trigger signal is transmitted from the controller 8, by the shift time d, as illustrated in FIG. 13. In FIG. 13, the delay time D after the correction is shown as D'.

Thereby, the noise compensation unit 81 may correct the timing when the trigger signal is transmitted from the controller 8 such that the pulse laser light 33 reaches the plasma generation region 25 at the timing when the droplet 271, the velocity of which is corrected, reaches the plasma generation region 25.

As the shift time d may correspond to the correction amount of the delay time D given to the timing when the trigger signal is transmitted, the shift time d is also referred to as a delay time correction amount d.

The noise compensation unit 81 may store the delay time correction amount d as a constant value in advance, if the velocity and the diameter of the droplet 271 and the width of the detection region R do not vary largely. The delay time correction amount d stored as a constant value may be 3 μs, for example.

Alternatively, the noise compensation unit 81 may correct the delay time correction amount d stored as a constant value from time to time, according to variations in the velocity and the diameter of the droplet 271.

The other part of the configuration of the EUV light generation device 1 of the first embodiment may be the same as that of the EUV light generation device 1 of the comparative example.

[4.2 Operation]

Operation of the EUV light generation device 1 of the first embodiment will be described. Specifically, processing performed by the noise compensation unit 81 included in the controller 8 will be described.

Regarding the operation of the EUV light generation device 1 of the first embodiment, description of the operation that is the same as the operation of the EUV light generation device 1 of the comparative example is omitted.

Figure 14:
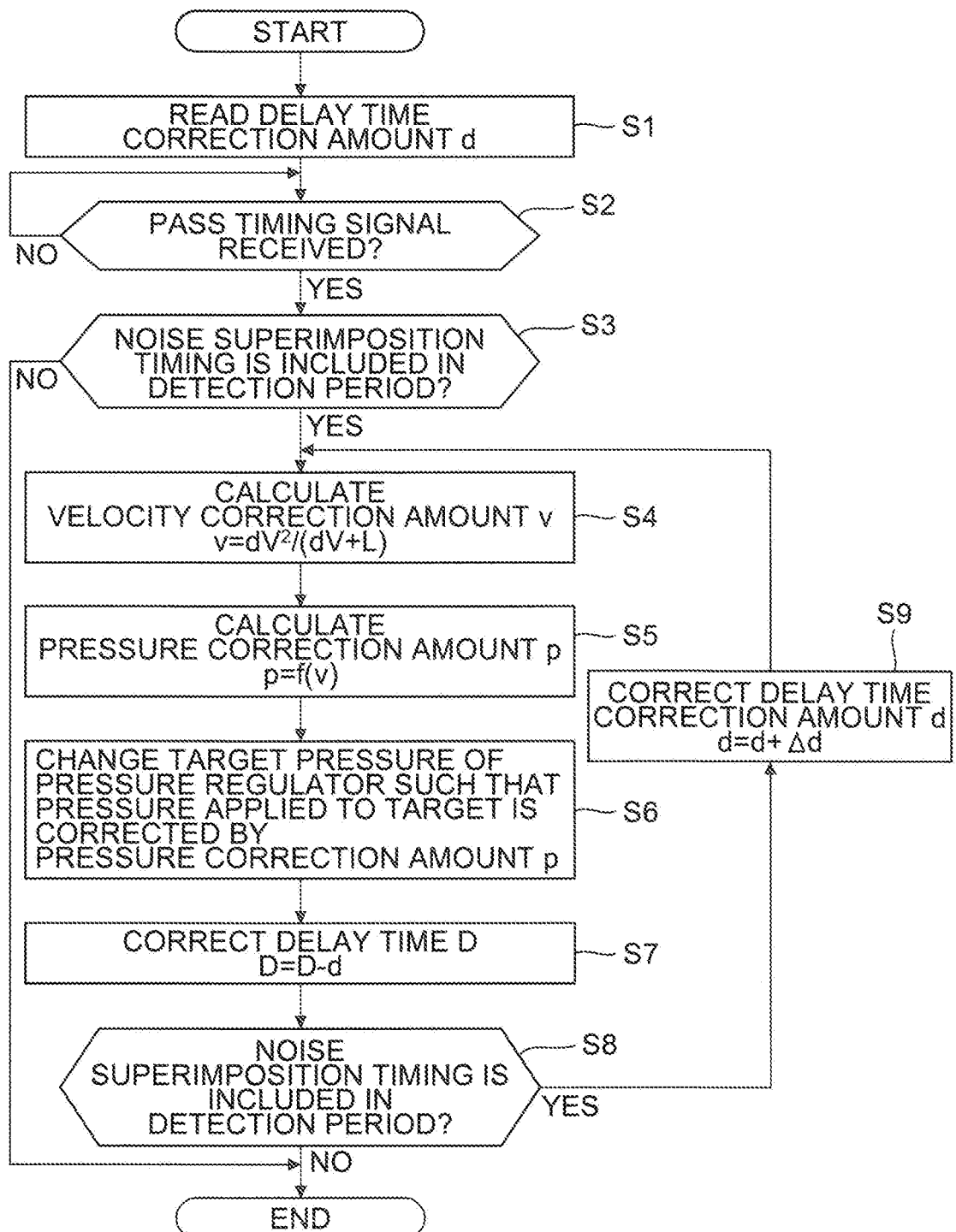
FIG. 14 is a flowchart for explaining processing performed by the noise compensation unit according to the first embodiment.

FIG. 14 is a flowchart for explaining the processing performed by the noise compensation unit 81 of the first embodiment.

At step S1, the noise compensation unit 81 may read the delay time correction amount d stored in advance.

At step S2, the noise compensation unit 81 may determine whether or not it received a pass timing signal from the droplet detector 41.

When the noise compensation unit 81 did not receive a pass timing signal, it may wait until it receives the pass timing signal. On the contrary, when the noise compensation unit 81 received the pass timing signal, it may move to step S3.

At step S3, the noise compensation unit 81 may determine whether or not the noise superimposition timing is included in the detection period.

When the noise superimposition timing is not included in the detection period, the noise may be masked by the noise masking function. Accordingly, the noise compensation unit 81 may end the processing.

On the contrary, when the noise superimposition timing is included in the detection period, the noise compensation unit 81 may move to step S4.

At step S4, the noise compensation unit 81 may calculate the velocity correction amount v.

The noise compensation unit 81 may calculate the velocity correction amount v with use of the following expression as described above:

$$v=dV^2/(dV+L) \qquad \text{Expression (3)}$$

At step S5, the noise compensation unit 81 may calculate the pressure correction amount p.

The noise compensation unit 81 may calculate the pressure correction amount p with use of the following expression as described above:

$$p=f(v) \qquad \text{Expression (4)}$$

At step S6, the noise compensation unit 81 may change the target pressure set by the pressure regulator 264a such that the pressure applied to the target 27 in the tank 261 is corrected by the pressure correction amount p.

The controller 8 may set the target pressure changed corresponding to the pressure correction amount p, to the pressure regulator 264a.

The pressure regulator 264a may adjust the pressure to be applied to the target 27 in the tank 261 by the pressure correction amount p to allow the pressure to be applied to the target 27 to approach the target pressure.

The velocity of the droplet 271 may be corrected by the velocity correction amount v corresponding to the pressure correction amount p.

At step S7, the noise compensation unit 81 may correct the predetermined delay time D.

The noise compensation unit 81 may correct the delay time D with use of the following expression:

$$D=D-d \qquad \text{Expression (5)}$$

The timing when the trigger signal is transmitted from the controller 8 may be corrected by the delay time correction amount d.

At step S8, the noise compensation unit 81 may determine whether or not the noise superimposition timing is included in the detection period.

When the noise superimposition timing is not included in the detection period, the noise compensation unit 81 may end the processing.

On the contrary, when the noise superimposition timing is included in the detection period, the noise compensation unit 81 may move to step S9.

At step S9, the noise compensation unit 81 may amend the delay time correction amount d.

The noise compensation unit 81 may amend the delay time correction amount d with use of the following expression:

$$d=d+\Delta d \qquad \text{Expression (6)}$$

Δd on the right side may be a correction amount of the delay time correction amount d. The correction amount Δd (μs) may be calculated with use of the following expression:

$$\Delta d=(Tr-(Ts+Tn))/10 \qquad \text{Expression (7)}$$

(Tr−(Ts+Tn)) on the right side may represent the size of the allowable range of the shift time d shown in Expression (1). By setting the value calculated by dividing {Tr−(Ts+Tn)} by 10 to be the correction amount Δd, the delay time correction amount d may be amended more accurately.

After amending the delay time correction amount d, the noise compensation unit 81 may move to step S4.

The other part of the operation of the EUV light generation device 1 of the first embodiment may be the same as that of the EUV light generation device 1 of the comparative example.

[4.3 Effect]

The noise compensation unit 81 according to the first embodiment can correct the velocity of the droplet 271 by correcting the pressure applied to the target 27 in the tank 261. Thereby, the noise compensation unit 81 of the first embodiment can isolate the noise superimposition timing from the detection period.

Then, the noise compensation unit 81 of the first embodiment can mask the noise superimposed on the pass timing signal at the timing of being isolated from the detection period.

Further, the noise compensation unit 81 of the first embodiment can correct the timing when a trigger signal is transmitted from the controller 8 such that the pulse laser light 33 reaches the plasma generation region 25 at the timing when the droplet 271, the velocity of which is corrected, reaches the plasma generation region 25.

Accordingly, even though the noise caused by the electromagnetic wave radiated from plasma is superimposed on the pass timing signal, the noise compensation unit 81 of the first embodiment can correct the noise superimposed on the pass timing signal.

Thereby, the controller 8 of the first embodiment can generate a droplet detection signal at appropriate timing based on the pass timing signal in which noise is compensated for by the noise compensation unit 81, and transmit a trigger signal to the laser device 3 at appropriate timing.

Consequently, the EUV light generation device 1 of the first embodiment can suppress variations in the pulse energy of the EUV light 252 among the pulses, and improve the energy stability of the EUV light 252.

5. Second Embodiment

An EUV light generation device 1 of a second embodiment will be described with use of FIG. 15.

The EUV light generation device 1 of the second embodiment may mainly differ from the EUV light generation device 1 of the first embodiment in the noise isolation function of the noise compensation unit 81.

Regarding the configuration of the EUV light generation device 1 of the second embodiment, description of the configuration that is the same as the configuration of the EUV light generation device 1 of the first embodiment is omitted.

[5.1 Configuration and Operation]

Figure 15:
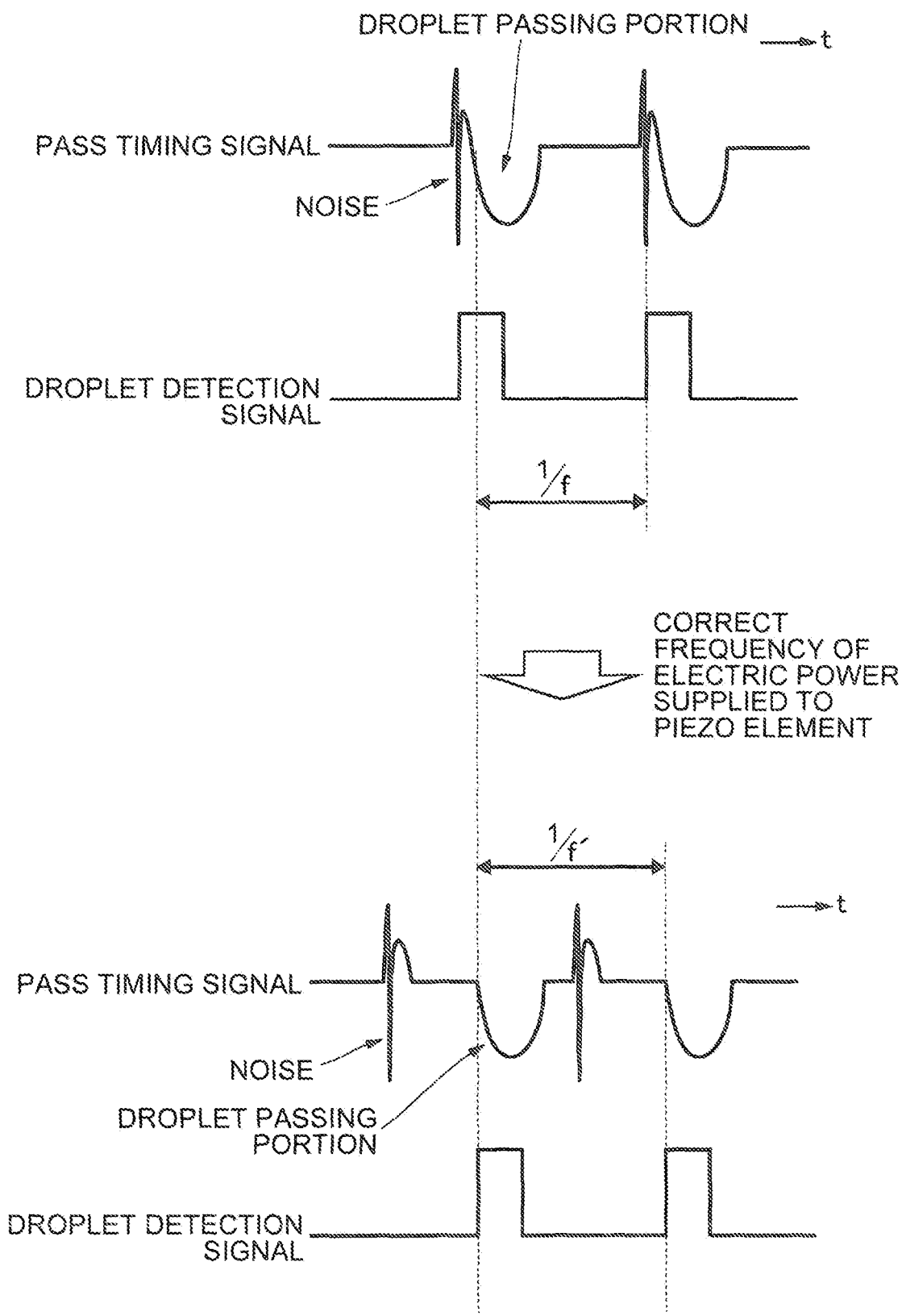
FIG. 15 is a diagram for explaining a noise isolation function of a noise compensation unit according to a second embodiment.

FIG. 15 is a diagram for explaining the noise isolation function of the noise compensation unit 81 according to the second embodiment.

As an aspect of the noise isolation function, the noise compensation unit 81 of the second embodiment may have a function of correcting a time interval between adjacent droplets 271 sequentially output into the chamber 2

When the time interval between the droplets 271 is changed, the timing when the droplet 271 reaches the detection region R may also be changed. Accordingly, the temporal position of the droplet passing portion of the pass timing signal may be changed.

This means that when the time interval between the droplets 271 is changed, the timing of starting the detection period may be changed.

Accordingly, by correcting the time interval between the droplets 271, the noise compensation unit 81 can isolate the timing when the noise caused by the electromagnetic wave radiated from plasma is superimposed on the pass timing signal, from the detection period.

The time interval between the droplets 271 may correspond to the cycle that the droplet 271 is generated from the target 27 jetted from the nozzle 262 into the chamber 2. The cycle of generating the droplet 271 may be related to the frequency of vibration applied to the target 27 jetted from the nozzle 262.

In order to correct the time interval between the droplets 271, the noise compensation unit 81 may correct the frequency of vibration applied to the target 27 jetted from the nozzle 262.

In order to correct the frequency of vibration applied to the target 27 jetted from the nozzle 262, the noise compensation unit 81 may correct the frequency of vibration applied to the neck portion 261*a* of the tank 261 by the piezo element 265*a*. Specifically, the noise compensation unit 81 may correct the frequency of the electric power supplied from the piezo power source 265*b* to the piezo element 265*a*.

In FIG. 15, f(kHz) represents the frequency of electric power before correction supplied from the piezo power source 265*b* to the piezo element 265*a*, and f' (kHz) represents the frequency of electric power after correction supplied from the piezo power source 265*b* to the piezo element 265*a*.

The correction amount of the frequency of the electric power supplied from the piezo power source 265*b* to the piezo element 265*a* may be the correction amount corresponding to the shift time d. For example, the correction amount (f-f') of the frequency may be the reciprocal of the shift time d.

Meanwhile, the target 27 jetted from the nozzle 262 may be separated to a plurality of fine droplets by the vibration of the piezo element 265*a* and then combined to form one droplet 271, before entering the detection region R.

At that time, the separated fine droplets may not be combined appropriately before entering the detection region R so that one droplet 271 having a sufficient mass may not be formed, depending on the frequency of the electric power after correction supplied to the piezo element 265*a*. In that case, the pulse laser light 33 may be radiated to the droplet 271 of insufficient mass, whereby the pulse energy of the EUV light 252 may drop.

Accordingly, the noise compensation unit 81 may have, in advance, a frequency that is a frequency of electric power to be supplied to the piezo element 265*a* and with which separated fine droplets are not combined appropriately before entering the detection region R, as an inhibited frequency. The inhibited frequency may be set previously through experiments or the like. Then, when correcting the frequency of the electric power to be supplied to the piezo element 265*a*, the noise compensation unit 81 may perform correction such that the frequency after correction does not become the inhibited frequency.

Alternatively, the noise compensation unit 81 may store, in advance, a frequency that is a frequency of electric power to be supplied to the piezo element 265*a* and with which separated fine droplets can be combined appropriately before entering the detection region R, as an allowed frequency. The allowed frequency may be set previously through experiments or the like. Then, when correcting the frequency of the electric power to be supplied to the piezo element 265*a*, the noise compensation unit 81 may perform correction such that the frequency after correction becomes an allowed frequency.

Further, in the case where the velocity of the droplet 271 is changed by correcting the frequency of the electric power supplied to the piezo element 265*a*, the noise compensation unit 81 may correct the delay time D by using the delay time correction function. Thereby, the noise compensation unit 81 may correct the timing when a trigger signal is transmitted from the controller 8.

The other part of the configuration of the noise compensation unit 81 according to the second embodiment may be the same as that of the noise compensation unit 81 of the first embodiment.

The other part of the configuration of the EUV light generation device 1 according to the second embodiment may be the same as that of the EUV light generation device 1 of the first embodiment.

[5.2 Effect]

The noise compensation unit 81 of the second embodiment can correct the time interval between the droplets 271 by correcting the frequency of vibration applied to the target 27 jetted from the nozzle 262. Thereby, the noise compensation unit 81 of the second embodiment can isolate the noise superimposition timing from the detection period, similar to the case of the first embodiment.

Then, the noise compensation unit 81 of the second embodiment can mask the noise superimposed on the pass timing signal at the timing when noise superimposition timing is isolated from the detection period, similar to the case of the first embodiment.

Further, when the velocity of the droplet 271 is changed, the noise compensation unit 81 of the second embodiment can correct the timing when a trigger signal is transmitted from the controller 8, similar to the case of the first embodiment.

Accordingly, even though the noise caused by the electromagnetic wave radiated from plasma is superimposed on the pass timing signal, the noise compensation unit 81 of the second embodiment can compensate for the noise superimposed on the pass timing signal, similar to the case of the first embodiment.

6. Third Embodiment

An EUV light generation device 1 of a third embodiment will be described with use of FIGS. 16 to 19.

The EUV light generation device 1 of the third embodiment may have a configuration in which a moving mechanism 45 is added to the EUV light generation device 1 of the first embodiment.

The EUV light generation device 1 of the third embodiment may differ from the EUV light generation device 1 of the first embodiment in the noise determination function, the noise isolation function, and the noise masking function of the noise compensation unit 81.

Regarding the configuration of the EUV light generation device 1 of the third embodiment, description of the configuration that is the same as the configuration of the EUV light generation device 1 of the first embodiment is omitted.

[6.1 Configuration]

Figure 16:
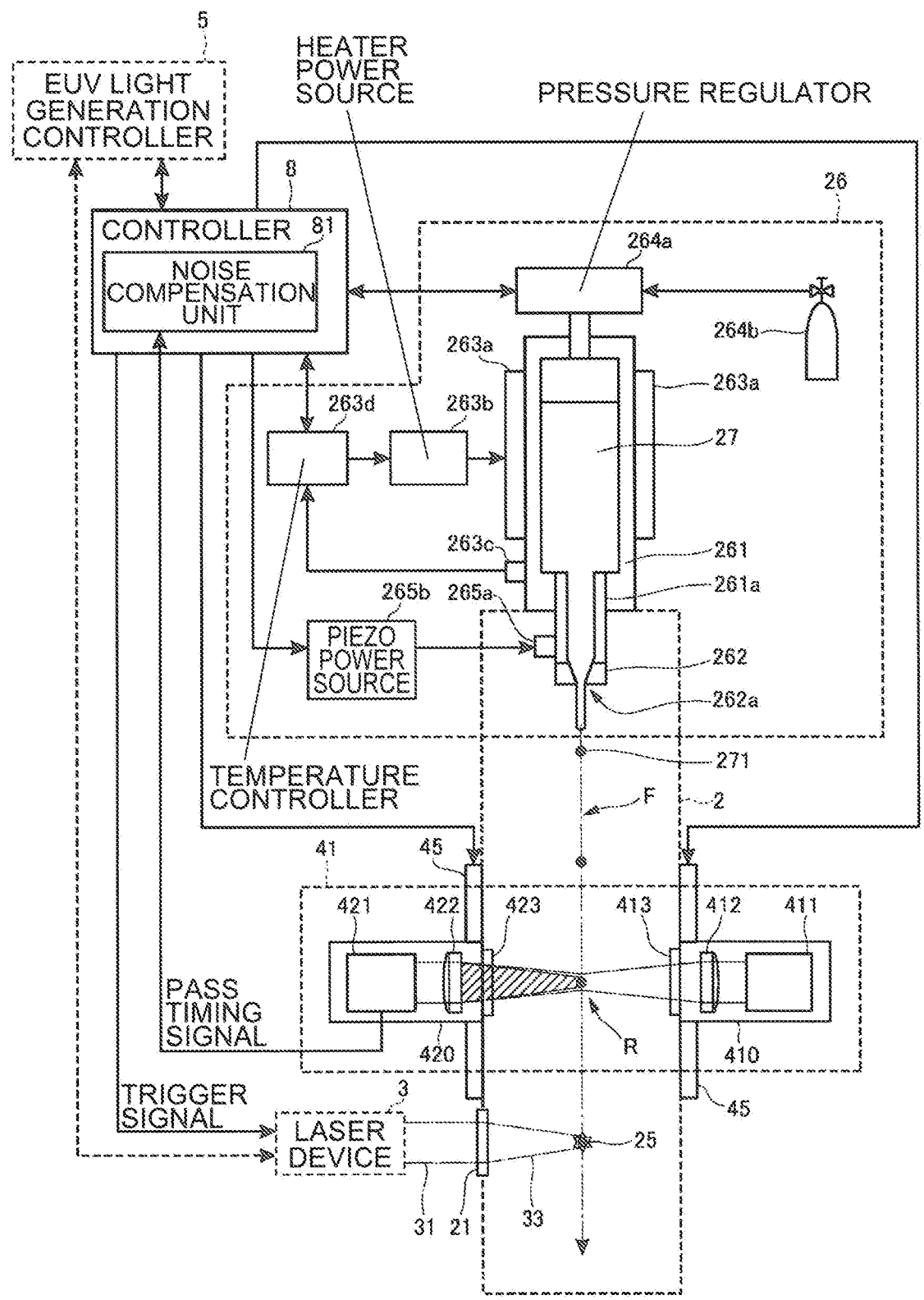
FIG. 16 is a diagram for explaining a configuration of an EUV light generation device of a third embodiment.

FIG. 16 is a diagram for explaining the configuration of the EUV light generation device 1 of the third embodiment.

The moving mechanism 45 of the third embodiment may be a mechanism of moving the position of the detection region R along the droplet trajectory F.

The moving mechanism 45 may be a stage for moving the position of the droplet detector 41 along the droplet trajectory F.

The moving mechanism 45 may be configured of a stage for moving the position of the light source unit 410 along the droplet trajectory F and a stage for moving the position of the light receiving unit 420 along the droplet trajectory F.

The moving mechanism 45 may move the positions of the light source unit 410 and the light receiving unit 420 in substantially parallel with the droplet trajectory F, respectively. The moving mechanism 45 may move the positions of the light source unit 410 and the light receiving unit 420 by substantially the same distance in the same direction, respectively.

The position of the detection region R on the droplet trajectory F may be moved according to the movement of the position of the droplet detector 41 by the moving mechanism 45.

Operation of the moving mechanism 45 may be controlled by the controller 8.

Figure 17:
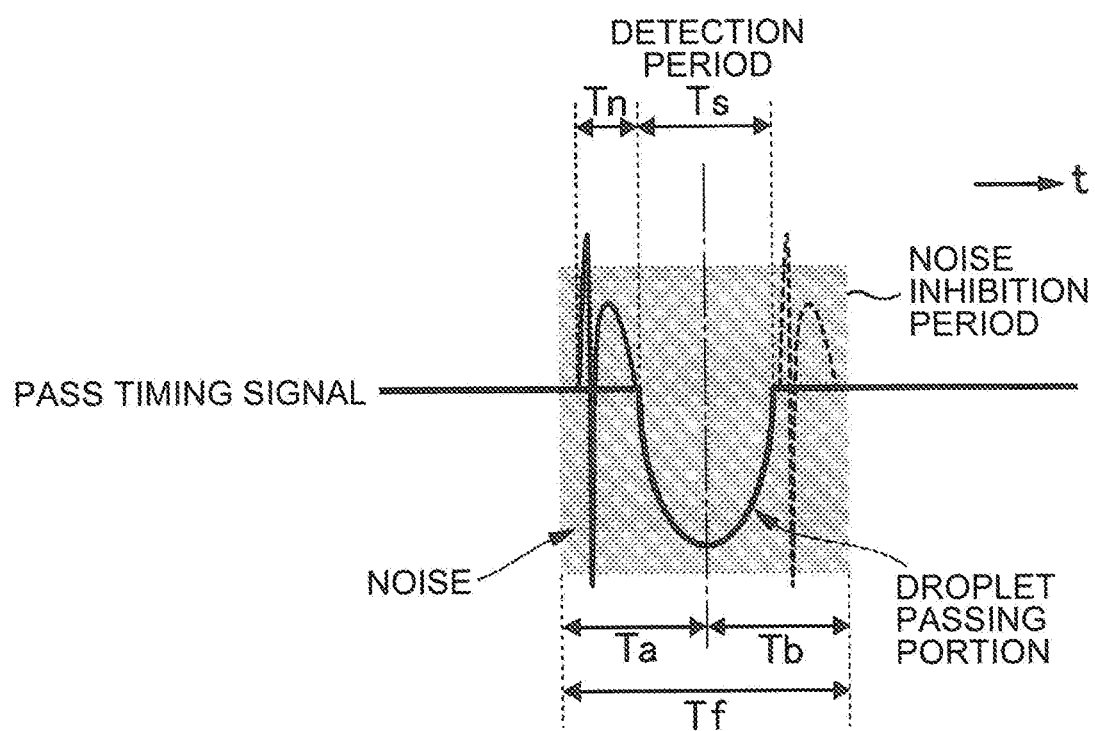
FIG. 17 is a diagram for explaining a noise determination function of a noise compensation unit according to the third embodiment.

FIG. 17 is a diagram for explaining the noise determination function of the noise compensation unit 81 of the third embodiment.

The noise compensation unit 81 of the third embodiment may determine whether or not the noise superimposition timing is included in a noise inhibition period Tf rather than the detection period.

Specifically, the noise compensation unit 81 of the third embodiment may determine whether or not noise is superimposed on a portion corresponding to the noise inhibition period Tf of the pass timing signal. Thereby, the noise compensation unit 81 of the third embodiment may determine whether or not the noise superimposition timing is included in the noise inhibition period Tf.

The noise inhibition period Tf may be a period including the detection period. The noise inhibition period Tf may be longer than the total time of the time width Ts of the droplet passing portion of the pass timing signal corresponding to the detection period and the time width Tn of the noise. The noise inhibition period Tf may be the total time of the time width Ts of the droplet passing portion of the pass timing signal corresponding to the detection period, the time width Tn of the noise, and a margin.

The margin may be set previously based on the processing capacity of the noise compensation unit 81 and the time resolution of the droplet detector 41. The margin may be set previously based on the variations in the time interval between the droplets 271.

The noise inhibition period Tf may include a first period Ta and a second period Tb.

The first period Ta may be a period from the timing when the noise inhibition period Tf starts to the timing when an extreme value of the pass timing signal is shown. The second period Tb may be a period from the timing when the extreme value of the pass timing signal is shown to the timing when the noise inhibition period Tf ends.

The first period Ta and the second period Tb of the noise inhibition period Tf may have substantially the same length. This means that the noise inhibition period Tf may be set before and after the timing when the extreme value of the pass timing signal is shown, for substantially the same period of time.

For example, the noise inhibition period Tf may be set before and after the timing when the extreme value of the pass timing signal is shown, for 1 μs each.

The noise compensation unit 81 may store the noise inhibition period Tf in advance.

When the noise is superimposed on the portion corresponding to the noise inhibition period Tf of the pass timing signal, the noise compensation unit 81 may determine that the noise superimposition timing is included in the noise inhibition period Tf.

When the noise is not superimposed on the portion corresponding to the noise inhibition period Tf of the pass timing signal, the noise compensation unit 81 may determine that the noise superimposition timing is not included in the noise inhibition period Tf.

FIG. 18 is a diagram for explaining the noise isolation function of the noise compensation unit 81 of the third embodiment.

The noise compensation unit 81 of the third embodiment may isolate the noise superimposition timing from the noise inhibition period Tf.

Specifically, the noise compensation unit 81 of the third embodiment may isolate the noise from the portion corresponding to the noise inhibition period Tf of the pass timing signal to thereby isolate the noise superimposition timing from the noise inhibition period Tf.

The noise inhibition period Tf may include the detection period. Isolating the noise superimposition timing from the noise inhibition period Tf may mean isolating the noise superimposition timing from the detection period.

In order to isolate the noise superimposition timing from the noise inhibition period Tf, the shift time d should be at least equal to or longer than the noise inhibition period Tf.

In order to secure the shift time d, the noise compensation unit 81 may correct the distance from the detection region R to the plasma generation region 25 on the droplet trajectory F. This means that as an aspect of the noise isolation function, the noise compensation unit 81 may have a function of correcting the distance from the detection region R to the plasma generation region 25.

The noise compensation unit 81 may correct the position of the detection region R in order to correct the distance from the detection region R to the plasma generation region 25. The noise compensation unit 81 may move the position of the droplet detector 41 by using the moving mechanism 45 in order to correct the position of the detection region R.

Here, as illustrated in FIG. 18, the position of the detection region R before correction is represented by R1. The position of the detection region R after the correction is represented by R2. A correction amount of a distance L from the detection region R to the plasma generation region 25 is represented by a distance correction amount Ls (μm).

In this case, the distance correction amount Ls may be the amount corresponding to the shift time d. The distance correction amount Ls may be described as the following Expression (8) using the shift time d and the velocity V of the droplet 271:

$$Ls = dV \qquad \text{Expression (8)}$$

In the case of changing the distance L from the detection region R to the plasma generation region 25, the timing of transmitting, to the laser device 3, a trigger signal that triggers output of the pulse laser light 33 to the plasma generation region 25 may be required to be corrected.

When the distance L is corrected by the distance correction amount Ls, appropriate timing of transmitting a trigger signal to the laser device 3 may be shifted by the shift time d corresponding to the distance correction amount Ls.

Accordingly, when the distance L is corrected by the distance correction amount Ls, the noise compensation unit 81 may correct the delay time D defining the timing when a trigger signal is transmitted from the controller 8 by the shift time d with use of the delay time correction function.

Thereby, the noise compensation unit 81 may correct the timing when a trigger signal is transmitted from the controller 8.

Further, the noise compensation unit 81 may mask the noise superimposed on the pass timing signal at the timing of being isolated from the noise inhibition period Tf.

Specifically, the noise compensation unit 81 may isolate the noise from the portion corresponding to the noise inhibition period Tf of the pass timing signal, and mask the noise superimposed on the pass timing signal at the timing of being isolated from the noise inhibition period Tf.

The noise compensation unit 81 may set a period other than the noise inhibition period Tf as the masking period.

The other part of the configuration of the noise compensation unit 81 of the third embodiment may be the same as that of the noise compensation unit 81 of the first embodiment.

The other part of the configuration of the EUV light generation device 1 of the third embodiment may be the same as that of the EUV light generation device 1 of the first embodiment.

[6.2 Operation]

Operation of the EUV light generation device 1 of the third embodiment will be described. Specifically, processing performed by the noise compensation unit 81 included in the controller 8 will be described.

Regarding the operation of the EUV light generation device 1 of the third embodiment, description of the operation that is the same as the operation of the EUV light generation device 1 of the first embodiment is omitted.

Figure 19:
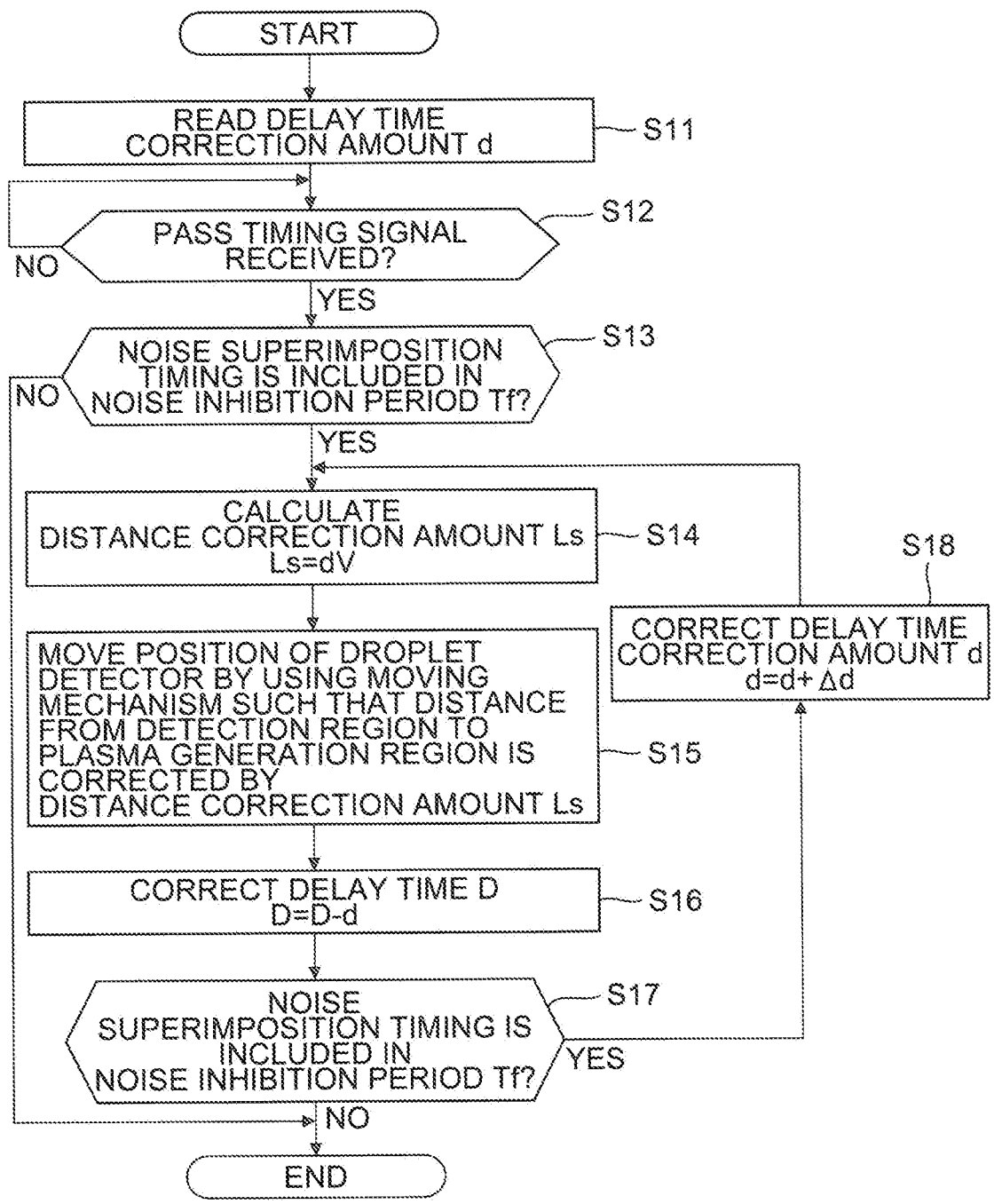
FIG. 19 is a flowchart for explaining processing performed by the noise compensation unit of the third embodiment.

FIG. 19 is a flowchart for explaining processing performed by the noise compensation unit 81 according to the third embodiment.

At steps S11 and S12, the noise compensation unit 81 may perform the same processing as that of steps S1 and S2 of FIG. 14.

At step S13, the noise compensation unit 81 may determine whether or not the noise superimposition timing is included in the noise inhibition period Tf.

When the noise superimposition timing is not included in the noise inhibition period Tf, the noise may be masked by the noise masking function. Accordingly, the noise compensation unit 81 may end the processing.

Meanwhile, when the noise superimposition timing is included in the noise inhibition period Tf, the noise compensation unit 81 may move to step S14.

At step S14, the noise compensation unit 81 may calculate the distance correction amount Ls of the distance L from the detection region R to the plasma generation region 25.

The noise compensation unit 81 may calculate the distance correction amount Ls according to the following expression as described above:

$$Ls = dV \qquad \text{Expression (8)}$$

At step S15, the noise compensation unit 81 may move the position of the droplet detector 41 by using the moving mechanism 45 such that the distance L from the detection region R to the plasma generation region 25 is corrected by the distance correction amount Ls.

The moving mechanism 45 may move the position of the droplet detector 41 by the distance correction amount Ls.

The distance L from the detection region R to the plasma generation region 25 may be corrected by the distance correction amount Ls.

At step S16, the noise compensation unit 81 may perform the same processing as that of step S7 of FIG. 14.

At step S17, the noise compensation unit 81 may determine whether or not the noise superimposition timing is included in the noise inhibition period Tf.

The noise compensation unit 81 may end the processing when the noise superimposition timing is not included in the noise inhibition period Tf.

On the contrary, the noise compensation unit 81 may move to step S18 when the noise superimposition timing is included in the noise inhibition period Tf.

At step S18, the noise compensation unit 81 may perform the same processing as that of step S9 of FIG. 14.

The noise compensation unit 81 may move to step S14 after step S18.

The other part of the operation of the EUV light generation device 1 of the third embodiment may be the same as that of the EUV light generation device 1 of the first embodiment.

[6.3 Effect]

The noise compensation unit 81 of the third embodiment can correct the distance from the detection region R to the plasma generation region 25 by correcting the position of the detection region R by using the moving mechanism 45. Thereby, the noise compensation unit 81 of the third embodiment can isolate the noise superimposition timing from the noise inhibition period Tf. At that time, as the noise inhibition period Tf may include the detection period, the noise compensation unit 81 of the third embodiment can isolate the noise superimposition timing from the detection period more reliably than the first embodiment.

Then, the noise compensation unit 81 of the third embodiment can mask the noise superimposed on the pass timing signal at the timing of being isolated from the noise inhibition period Tf.

Further, the noise compensation unit 81 of the third embodiment can correct the timing when a trigger signal is transmitted from the controller 8. Specifically, the noise compensation unit 81 of the third embodiment can perform correction such that the pulse laser light 33 reaches the plasma generation region 25 at the timing when the droplet 271 passing through the detection region R with the distance L corrected reaches the plasma generation region 25.

Accordingly, even when the noise caused by the electromagnetic wave radiated from plasma is superimposed on the pass timing signal, the noise compensation unit 81 of the third embodiment can compensate for the noise superimposed on the pass timing signal more reliably than the first embodiment.

7. Fourth Embodiment

An EUV light generation device 1 of a fourth embodiment will be described with use of FIGS. 20 to 22.

The EUV light generation device 1 of the fourth embodiment may differ from the EUV light generation device 1 of the third embodiment in the noise determination function of the noise compensation unit 81.

Regarding the configuration of the EUV light generation device 1 of the fourth embodiment, description of the configuration that is the same as the configuration of the EUV light generation device 1 of the third embodiment is omitted.

[7.1 Configuration and Operation]

Figure 20:
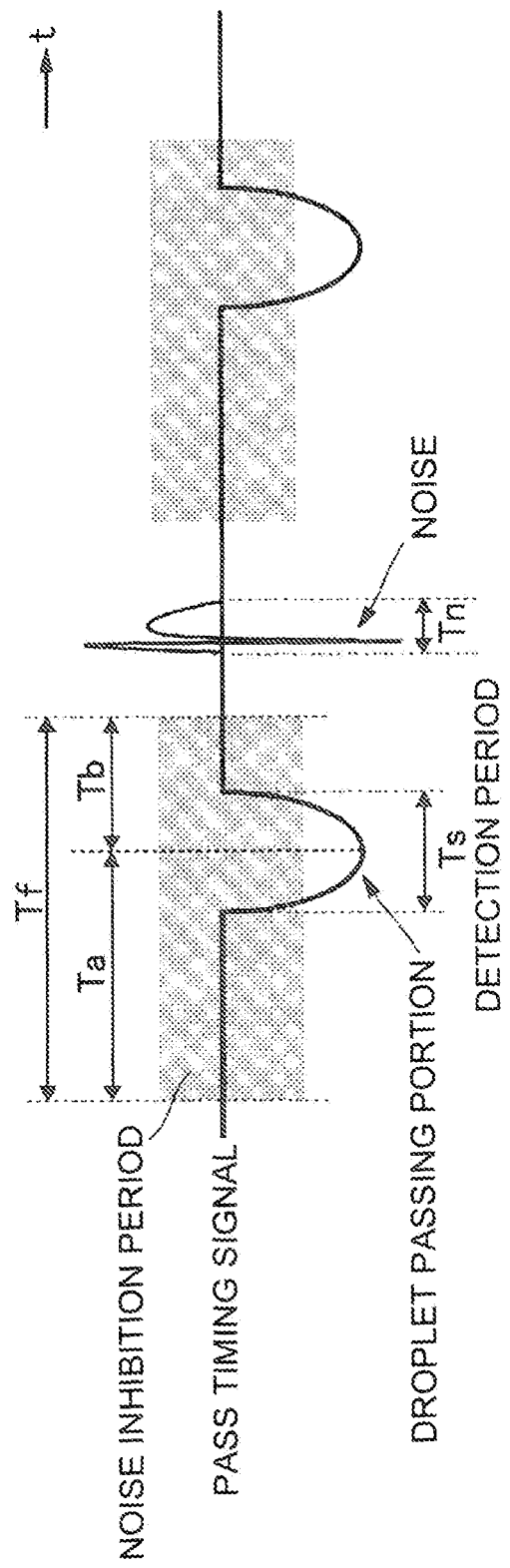
FIG. 20 is a diagram for explaining a noise inhibition period according to a fourth embodiment.

FIG. 20 is a diagram for explaining a noise inhibition period Tf of the fourth embodiment.

The noise compensation unit 81 of the fourth embodiment may set the noise inhibition period Tf as described below.

In the noise inhibition period Tf of the fourth embodiment, the first period Ta may be longer than the second period Tb. In the noise inhibition period Tf of the fourth embodiment, the first period Ta may be longer than the second period Tb by the time width Tn of the noise.

The first period Ta and the second period Tb of the fourth embodiment may be described as the following Expression (9) and Expression (10) respectively:

$$Ta > Tn + Ts/2 \qquad \text{Expression (9)}$$

$$Tb > Ts/2 \qquad \text{Expression (10)}$$

Figure 21:
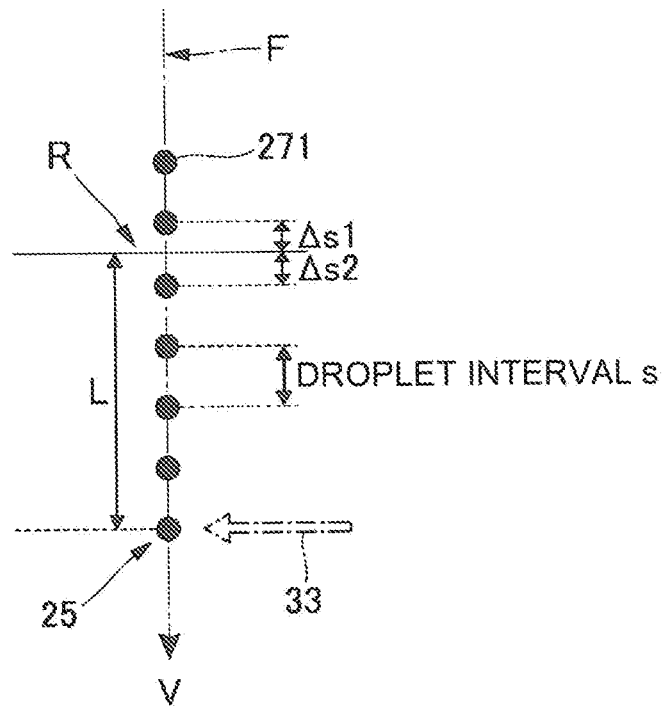
FIG. 21 is a diagram for explaining a noise determination function of a noise compensation unit according to the fourth embodiment.

FIG. 21 is a diagram for explaining the noise determination function of the noise compensation unit 81 of the fourth embodiment. FIG. 22 is a diagram for explaining the noise determination function of the noise compensation unit 81 of the fourth embodiment, illustrating the relationship between the noise inhibition period Tf and a spatial gap s between the droplets 271.

Figure 22:
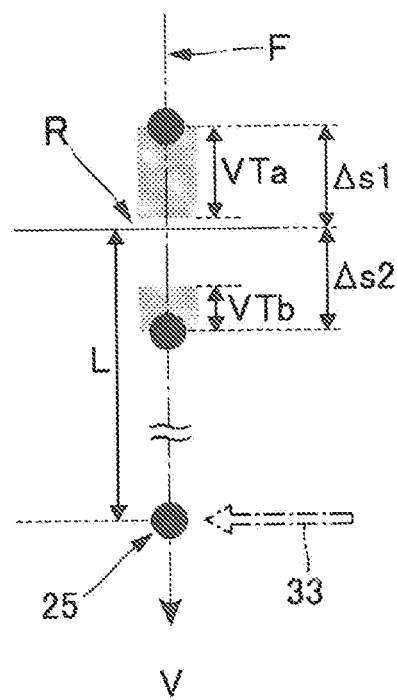
FIG. 22 is a diagram for explaining the noise determination function of the noise compensation unit according to the fourth embodiment, illustrating a relationship between the noise inhibition period and a spatial gap between droplets.

FIGS. 21 and 22 illustrate the case where the detection region R is positioned between the droplets 271 at the timing when the droplet 271 that reached the plasma generation region 25 is irradiated with the pulse laser light 33.

The timing when the droplet 271 that reached the plasma generation region 25 is irradiated with the pulse laser light 33 is also referred to as radiation timing of the pulse laser light 33.

The radiation timing of the pulse laser light 33 may be considered to be substantially the same as the noise superimposition timing.

At the radiation timing of the pulse laser light 33, when the detection region R is positioned between the droplets 271, the noise superimposition timing may be isolated from at least the detection period.

The noise compensation unit 81 of the fourth embodiment may not determine whether or not the noise superimposition timing is included in the noise inhibition period Tf based on the pass timing signal and the signal waveform of the noise.

The noise compensation unit 81 of the fourth embodiment may determine whether or not the noise superimposition timing is included in the noise inhibition period Tf based on the various parameters of the droplet detector 41 and the droplet 271.

The various parameters of the droplet detector 41 and the droplet 271 may include the distance L from the detection region R to the plasma generation region 25, the spatial gap s between the droplets 271, and the velocity V thereof.

Here, as illustrated in FIGS. 21 and 22, a distance between the droplet 271 located immediately above the detection region R and the detection region R is represented by Δs1. A distance between the droplet 271 positioned immediately below the detection region R and the detection region R is represented by Δs2. The spatial gap s between the droplets 271 may be the total value of Δs1 and Δs2.

Further, the number of the droplets 271 existing between the detection region R and the plasma generation region 25 is represented by N. The number N of the droplets 271 may be described as the following Expression (11):

$$N = \text{int}(L/s) \qquad \text{Expression (11)}$$

int( ) on the right side may represent an INT function that obtains a solution as an integer by rounding down the decimal points in the calculation result of ( ).

Δs1 and Δs2 may be described as the following Expressions (12) and (13) respectively:

$$\Delta s1 = (N+1)s - L \qquad \text{Expression (12)}$$

$$\Delta s2 = L - Ns \qquad \text{Expression (13)}$$

In that case, the noise compensation unit 81 of the fourth embodiment may determine that the noise superimposition timing is included in the noise inhibition period Tf when Δs1 or Δs2 satisfies the relationship of the following Expression (14) or (15):

$$\Delta s1/V \le Ta \qquad \text{Expression (14)}$$

$$\Delta s2/V \le Tb \qquad \text{Expression (15)}$$

Expression (14) may mean that at the radiation timing of the pulse laser light 33, when Δs1 is VTa or shorter, the noise superimposition timing is included in the first period Ta of the noise inhibition period Tf.

Expression (15) may mean that at the radiation timing of the pulse laser light 33, when Δs2 is VTb or shorter, the noise superimposition timing is included in the second period Tb of the noise inhibition period Tf.

This means that at the radiation timing of the pulse laser light 33, when the detection region R is located at a position separated beyond VTa from the droplet 271 positioned immediately above the detection region R, the noise superimposition timing may be isolated from the first period Ta.

Further, at the radiation timing of the pulse laser light 33, when the detection region R is located at a position separated beyond VTb from the droplet 271 positioned immediately below the detection region R, the noise superimposition timing may be isolated from the second period Tb.

Accordingly, at the radiation timing of the pulse laser light 33, when the detection region R is located at a position separated beyond VTa and VTb from the droplets 271 positioned immediately above and immediately below the detection region R respectively, the noise superimposition timing may be isolated from the noise inhibition period Tf.

The noise compensation unit 81 of the fourth embodiment may correct the distance L from the detection region R to the plasma generation region 25 such that the position of the detection region R is located at such a position at the radiation timing of the pulse laser light 33. Specifically, the noise compensation unit 81 may move the position of the droplet detector 41 by using the moving mechanism 45 such that the position of the detection region R is located at such a position at the radiation timing of the pulse laser light 33.

At that time, the noise compensation unit 81 may move the position of the droplet detector 41 such that the distance L from the detection region R to the plasma generation region 25 becomes 2 mm or longer but 6 mm or shorter, for example. The noise compensation unit 81 may move the position of the droplet detector 41 such that the distance L from the detection region R to the plasma generation region 25 becomes at least one of 2 mm, 4 mm, and 6 mm, for example.

The other part of the configuration of the noise compensation unit 81 of the fourth embodiment may be the same as that of the noise compensation unit 81 of the third embodiment.

The other part of the configuration of the EUV light generation device 1 of the fourth embodiment may be the same as that of the EUV light generation device 1 of the third embodiment.

[7.2 Effect]

The noise compensation unit 81 of the fourth embodiment can determine whether or not the noise superimposition timing is included in the noise inhibition period Tf, based on the respective parameters of the droplet detector 41 and the droplet 271. Thereby, the noise compensation unit 81 of the fourth embodiment can determine whether or not the noise superimposition timing is included in the noise inhibition period Tf with a relatively simple configuration, without a signal waveform analyzing device.

Further, the noise compensation unit 81 of the fourth embodiment can correct the distance from the detection region R to the plasma generation region 25 by correcting the position of the detection region R with use of the moving mechanism 45, similar to the case of the third embodiment. Thereby, the noise compensation unit 81 of the fourth embodiment can isolate the noise superimposition timing from the noise inhibition period Tf.

Then, the noise compensation unit 81 of the fourth embodiment can mask the noise superimposed on the pass timing signal at the timing of being isolated from the noise inhibition period Tf, similar to the case of the third embodiment.

Further, the noise compensation unit 81 of the fourth embodiment can correct the timing when a trigger signal is transmitted from the controller 8, similar to the case of the third embodiment.

Accordingly, even when the noise caused by the electromagnetic wave radiated from plasma is superimposed on the pass timing signal, the noise compensation unit 81 of the fourth embodiment can compensate for the noise superimposed on the pass timing signal, similar to the case of the third embodiment.

8. Fifth Embodiment

An EUV light generation device 1 of a fifth embodiment will be described with use of FIG. 23.

The EUV light generation device 1 of the fifth embodiment may differ from the EUV light generation device 1 of the third embodiment in the configurations of the droplet detector 41 and the moving mechanism 45.

Regarding the configuration of the EUV light generation device 1 of the fifth embodiment, description of the configuration that is the same as the configuration of the EUV light generation device 1 of the third embodiment is omitted.

[8.1 Configuration and Operation]

Figure 23:
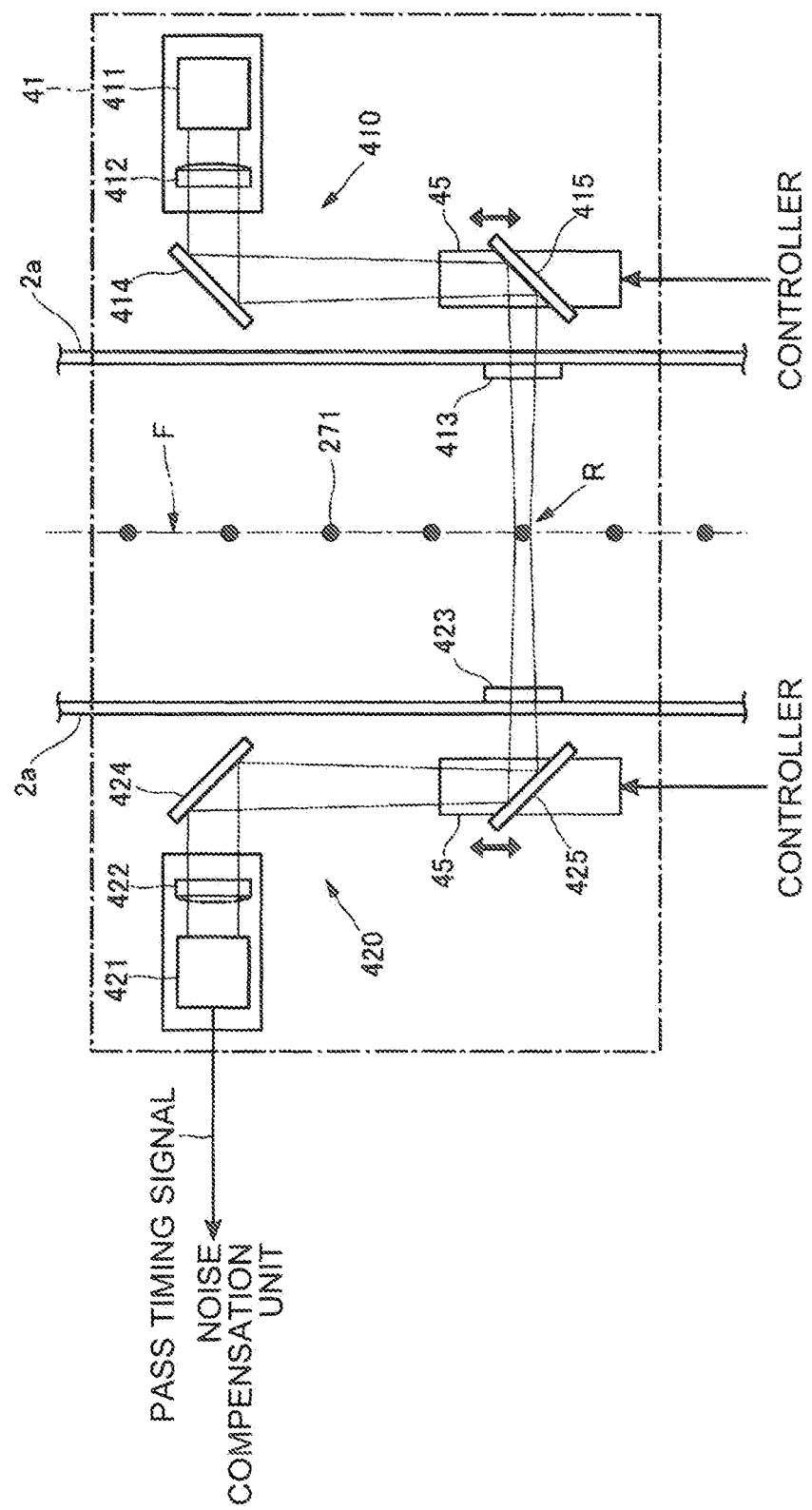
FIG. 23 is a diagram for explaining a droplet detector and a moving mechanism according to a fifth embodiment.

FIG. 23 is a diagram for explaining the droplet detector 41 and the moving mechanism 45 of the fifth embodiment.

The droplet detector 41 of the fifth embodiment may be configured such that a plurality of transmission optical elements are provided on the optical path of the illumination light output from the light source unit 410 to the detection region R.

The transmission optical elements may include a mirror 414, a mirror 415, a mirror 424, and a mirror 425, for example.

The mirror 414 and the mirror 415 may be included in the light source unit 410.

The mirror 424 and the mirror 425 may be included in the light receiving unit 420.

The mirror 414 may be disposed on the optical path of the illumination light that passed through the illumination optical system 412.

The mirror 414 may be disposed to face the illumination optical system 412 and the mirror 415 respectively.

The mirror 414 may reflect the illumination light that passed through the illumination optical system 412 to guide it to the mirror 415.

The mirror 415 may be disposed on the optical path of the illumination light reflected by the mirror 414.

The mirror 415 may be disposed to face the mirror 414 and the window 413 respectively.

The mirror 415 may reflect the illumination light reflected by the mirror 414 to guide it to the detection region R via the window 413.

The mirror 415 may be mounted on the moving mechanism 45.

The mirror 425 may be disposed on the optical path of the illumination light that passed through the window 423.

The mirror 425 may be disposed to face the window 423 and the mirror 424 respectively.

The mirror 425 may reflect the illumination light that passed through the window 423 to guide it to the mirror 424.

The mirror 425 may be mounted on the moving mechanism 45.

The mirror 425 may be disposed to face the mirror 415 over the detection region R on the droplet trajectory F.

The mirror 424 may be disposed on the optical path of the illumination light reflected by the mirror 425.

The mirror 424 may be disposed to face the mirror 425 and the light receiving optical system 422 respectively.

The mirror 424 may reflect the illumination light reflected by the mirror 425 to guide it to the light receiving optical system 422.

The other part of the configuration of the droplet detector 41 according to the fifth embodiment may be the same as that of the droplet detector 41 of the third embodiment.

The moving mechanism 45 of the fifth embodiment may be configured of a stage for moving the position of the mirror 415 along the droplet trajectory F and a stage for moving the position of the mirror 425 along the droplet trajectory F.

The moving mechanism 45 may move the respective positions of the mirror 415 and the mirror 425 in substantially parallel with the droplet trajectory F. The moving mechanism 45 may move the respective positions of the mirror 415 and the mirror 425 in the same direction by substantially the same distance.

The position of the detection region R on the droplet trajectory F may be moved according to the movement of the respective positions of the mirror 415 and the mirror 425 by the moving mechanism 45.

Operation of the moving mechanism 45 may be controlled by the controller 8.

The other part of the configuration of the moving mechanism 45 of the fifth embodiment may be the same as that of the moving mechanism 45 of the third embodiment.

The other part of the configuration of the EUV light generation device 1 of the fifth embodiment may be the same as that of the EUV light generation device 1 of the third embodiment.

[8.2 Effect]

When the distance L from the detection region R to the plasma generation region 25 is corrected, the moving mechanism 45 according to the fifth embodiment can move the position of the detection region R in a state where the light source 411, the illumination optical system 412, the light receiving optical system 422, and the optical sensor 421 are fixed.

As such, the moving mechanism 45 of the fifth embodiment can prevent an error from being caused between the moving distance of the light source 411 and the illumination optical system 412 and the moving distance of the optical sensor 421 and the light receiving optical system 422 along with the movement of the entire droplet detector 41.

Thereby, the moving mechanism 45 of the fifth embodiment can prevent deviation of the actually moved position of the detection region R from the position of the detection region R reflecting the distance correction amount Ls calculated by the noise compensation unit 81 due to occurrence an error related to the moving distances thereof.

Accordingly, even when the noise caused by the electromagnetic wave radiated from plasma is superimposed on the pass timing signal, the noise compensation unit 81 of the fifth embodiment can compensate for the noise superimposed on the pass timing signal more reliably than the third embodiment.

9. Sixth Embodiment

An EUV light generation device 1 of a sixth embodiment will be described with use of FIG. 24.

The EUV light generation device 1 of the sixth embodiment may differ from the EUV light generation device 1 of the third embodiment in the configurations of the droplet detector 41 and the moving mechanism 45.

Regarding the configuration of the EUV light generation device 1 of the sixth embodiment, description of the configuration that is the same as the configuration of the EUV light generation device 1 of the third embodiment is omitted.

[9.1 Configuration and Operation]

Figure 24:
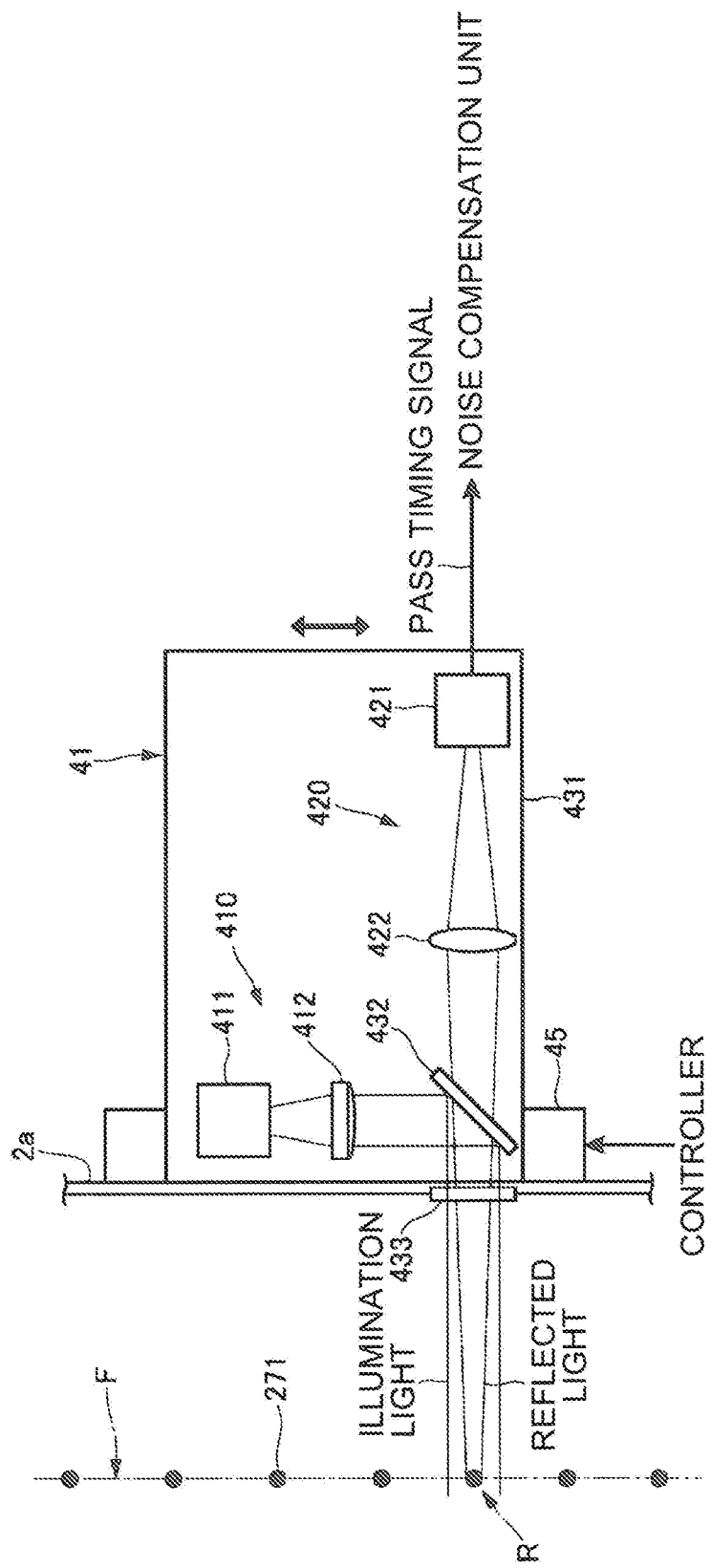
FIG. 24 is a diagram for explaining a droplet detector and a moving mechanism according to a sixth embodiment.

FIG. 24 is a diagram for explaining the droplet detector 41 and the moving mechanism 45 of the sixth embodiment.

The droplet detector 41 of the sixth embodiment may not be disposed such that the light source unit 410 and the light receiving unit 420 face each other over the detection region R on the droplet trajectory F.

The droplet detector 41 of the sixth embodiment may be configured such that the light source unit 410 and the light receiving unit 420 are disposed in one casing 431.

The droplet detector 41 of the sixth embodiment may include the light source 411, the illumination optical system 412, the optical sensor 421, the light receiving optical system 422, the casing 431, a partial reflecting mirror 432, and a window 433.

The respective constitutional elements of the droplet detector 41 of the sixth embodiment may be disposed such that the optical path axis of the illumination light output to the detection region R and the optical path axis of the reflected light from the droplet 271 substantially coincide with each other between the partial reflecting mirror 432 and the detection region R.

The reflected light from the droplet 271 may be illumination light reflected by the droplet 271 passing through the detection region R when the droplet 271 passing through the detection region R is irradiated with the illumination light output to the detection region R.

The casing 431 may accommodate the light source 411, the illumination optical system 412, the optical sensor 421, the light receiving optical system 422, and the partial reflecting mirror 432. The casing 431 may also accommodate the light source 411, the illumination optical system 412, the optical sensor 421, the light receiving optical system 422, and the partial reflecting mirror 432, in a state where the positions thereof are fixed.

The casing 431 may be mounted on the moving mechanism 45.

The partial reflecting mirror 432 may be disposed on the optical path of the illumination light that passed through the illumination optical system 412.

The partial reflecting mirror 432 may be disposed to face the illumination optical system 412 and the window 433 respectively. The partial reflecting mirror 432 may be disposed such that the illumination light that passed through the illumination optical system 412 is made incident at an incident angle of about 45°.

The partial reflecting mirror 432 may reflect part of the illumination light that passed through the illumination optical system 412 and is made incident at an incident angle of about 45°, and guide it to the detection region R via the window 433. The partial reflecting mirror 432 may be configured to have a reflectance of about 50% of the wavelength of the illumination light made incident at an incident angle of about 45°.

The partial reflecting mirror 432 may be disposed on the optical path of the reflected light from the droplet 271 that passed through the window 433.

The partial reflecting mirror 432 may be disposed such that the reflected light from the droplet 271 that passed through the window 433 is made incident at an incident angle of about 45°.

The partial reflecting mirror 432 may transmit part of the reflected light from the droplet 271 that passed through the window 433, and guide it to the light receiving optical system 422.

The window 433 may be provided to the wall 2a of the target supplying path 2b that is a part of the chamber 2.

The window 433 may be disposed on the optical path of the illumination light reflected by the partial reflecting mirror 432.

The window 433 may transmit the illumination light reflected by the partial reflecting mirror 432 toward the detection region R.

The window 433 may transmit the reflected light from the droplet 271 toward the light receiving optical system 422.

The light receiving optical system 422 may be disposed on the optical path of the reflected light from the droplet 271 that passed through the partial reflecting mirror 432.

The other part of the configuration of the droplet detector 41 according to the sixth embodiment may be the same as that of the droplet detector 41 of the third embodiment.

The moving mechanism 45 of the sixth embodiment may be configured of a stage for moving the position of the casing 431 along the droplet trajectory F.

The moving mechanism 45 may move the position of the casing 431 in substantially parallel with the droplet trajectory F.

The position of the detection region R on the droplet trajectory F may be moved according to the movement of the position of the casing 431 by the moving mechanism 45.

Operation of the moving mechanism 45 may be controlled by the controller 8.

The other part of the configuration of the moving mechanism 45 according to the sixth embodiment may be the same as that of the moving mechanism 45 of the third embodiment.

The other part of the configuration of the EUV light generation device 1 according to the sixth embodiment may be the same as that of the EUV light generation device 1 of the third embodiment.

[9.2 Effect]

The moving mechanism 45 of the sixth embodiment can be configured of one stage for moving the position of the casing 431.

This means that when the distance L from the detection region R to the plasma generation region 25 is corrected, the moving mechanism 45 of the sixth embodiment can move the detection region R in a state where the relative positions of the light source 411, the illumination optical system 412, the optical sensor 421, and the light receiving optical system 422 are fixed with respect to the casing 431.

Accordingly, the moving mechanism 45 of the sixth embodiment can prevent an error from being caused between the moving distance of the light source 411 and the illumination optical system 412 and the moving distance of the optical sensor 421 and the light receiving optical system 422, along with the movement of the entire droplet detector 41.

Thereby, the moving mechanism 45 of the sixth embodiment can prevent deviation of the actually moved position of the detection region R from the position of the detection region R reflecting the distance correction amount Ls calculated by the noise compensation unit 81 due to occurrence of an error related to the moving distances thereof.

Therefore, even when the noise caused by the electromagnetic wave radiated from plasma is superimposed on the pass timing signal, the noise compensation unit 81 of the sixth embodiment can compensate for the noise superimposed on the pass timing signal more reliably than the third embodiment.

10. Others

[10.1 Hardware Environment of Each Controller]

A person skilled in the art will understand that the subject described herein can be implemented by combining a general purpose computer or a programmable controller and a program module or a software application. In general, a program module includes a routine, a program, a component, a data structure, and the like capable of implementing the processes described in the present disclosure.

Figure 25:
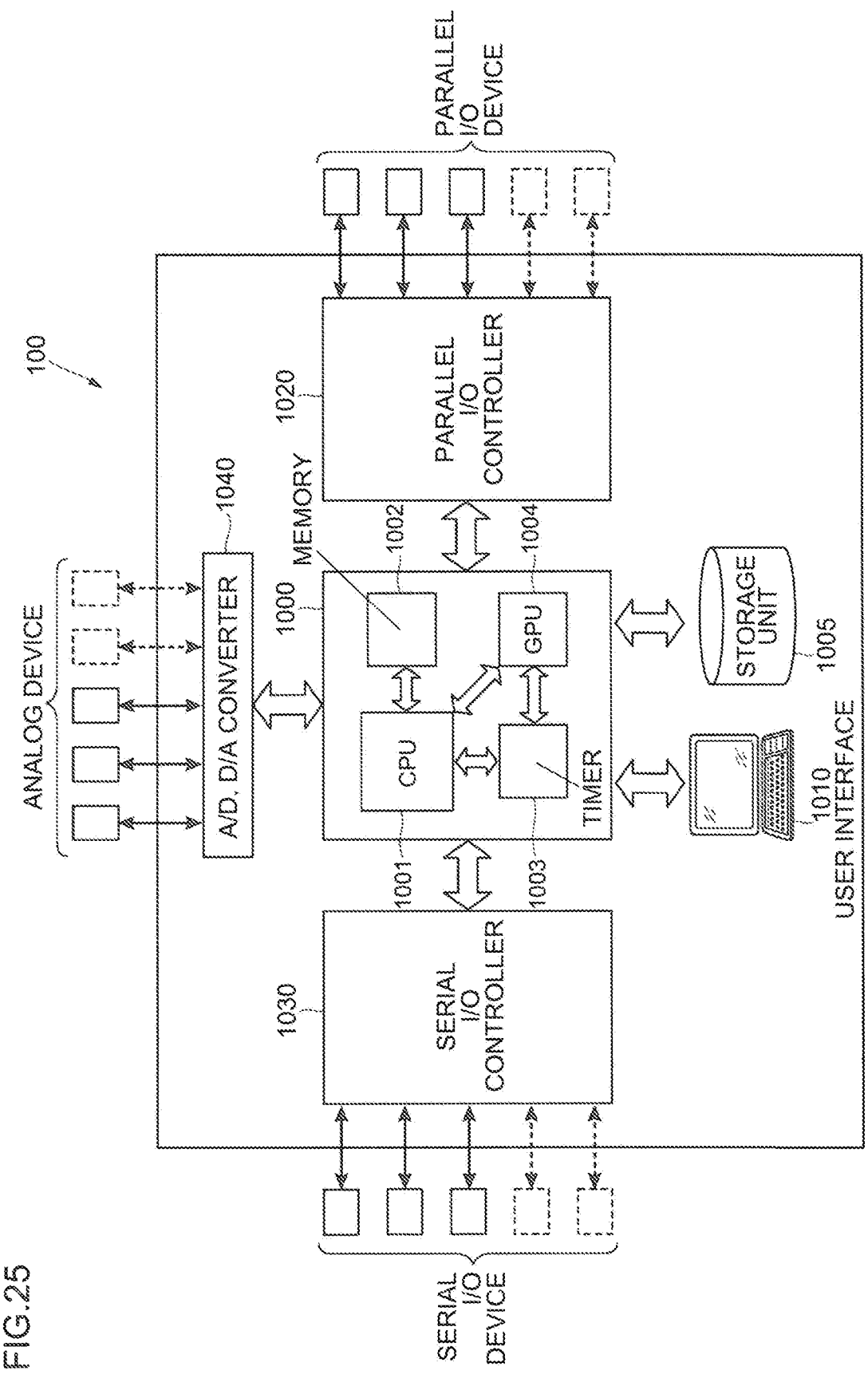
FIG. 25 is a block diagram illustrating a hardware environment of each controller.

FIG. 25 is a block diagram illustrating an exemplary hardware environment in which various aspects of the disclosed subject can be implemented. The exemplary hardware environment 100 of FIG. 25 may include a processing unit 1000, a storage unit 1005, a user interface 1010, a parallel I/O controller 1020, a serial I/O controller 1030, an A/D and D/A converter 1040. However, configuration of the hardware environment 100 is not limited to this.

The processing unit 1000 may include a central processing unit (CPU) 1001, a memory 1002, a timer 1003, and an image processing unit (GPU) 1004. The memory 1002 may include a random access memory (RAM) and a read only memory (ROM).

The CPU 1001 may be any commercially available processor. A dual microprocessor or another multiprocessor architecture may be used as the CPU 1001.

These constituent elements in FIG. 25 may be connected with each other to perform processes described in the present disclosure.

In the operation, the processing unit 1000 may read and execute a program stored in the storage unit 1005. The processing unit 1000 may also read data along with a program from the storage unit 1005. The processing unit 1000 may also write data to the storage unit 1005. The CPU 1001 may execute a program read from the storage unit 1005. The memory 1002 may be a work region for temporarily storing a program to be executed by the CPU 1001 and data to be used for operation of the CPU 1001. The timer 1003 may measure the time interval and output a measurement result to the CPU 1001 in accordance with execution of a program. The GPU 1004 may process image data according to a program read from the storage unit 1005, and output a processing result to the CPU 1001.

The parallel I/O controller 1020 may be connected with a parallel I/O device communicable with the processing unit 1000, such as the exposure device controller 61, the EUV light generation controller 5, the temperature controller 263d, the controller 8, or the like, and may control communication between the processing unit 1000 and such a parallel I/O device. The serial I/O controller 1030 may be connected with a serial I/O device communicable with the processing unit 1000, such as the laser light travel direction controller 34, the heater 263a, the heater power source 263b, the pressure regulator 264a, the piezo power source 265b, the light source 411, the moving mechanism 45, or the like, and may control communication between the processing unit 1000 and such a serial I/O device. The A/D and D/A converter 1040 may be connected with an analog device such as the target sensor 4, the temperature sensor 263c, the piezo element 265a, the optical sensor 421, or the like, via an analog port, and may control communication between the processing unit 1000 and such an analog device, or perform A/D or D/A conversion of the communication content.

The user interface 1010 may display the progress of a program executed by the processing unit 1000 to the operator such that the operator can instruct the processing unit 1000 to stop the program or execute a cutoff routine.

The exemplary hardware environment 100 may be applied to the configurations of the exposure device controller 61, the EUV light generation controller 5, the temperature controller 263d, the controller 8, and other devices of the present disclosure. A person skilled in the art will understand that such controllers may be realized in a distributed computing environment, that is, an environment in which a task is executed by processing units connected over a communication network. In the present disclosure, the exposure device controller 61, the EUV light generation controller 5, the temperature controller 263d, the controller 8, and other devices may be connected with one another over a communication network such as Ethernet or the Internet. In a distributed computing environment, a program module may be stored in memory storage devices of both local and remote.

[10.2 Other Modifications and the Like]

It will be obvious to those skilled in the art that the techniques of the embodiments described above are applicable to each other including the modifications.

The description provided above is intended to provide just examples without any limitations. Accordingly, it will be obvious to those skilled in the art that changes can be made to the embodiments of the present disclosure without departing from the scope of the accompanying claims.

The terms used in the present description and in the entire scope of the accompanying claims should be construed as terms "without limitations". For example, a term "including" or "included" should be construed as "not limited to that described to include". A term "have" should be construed as "not limited to that described to be held". Moreover, a modifier "a/an" described in the present description and in the accompanying claims should be construed to mean "at least one" or "one or more".

What is claimed is:

1. An extreme ultraviolet light generation device used together with a laser device configured to output laser light, the extreme ultraviolet light generation device comprising:
   a chamber in which extreme ultraviolet light is generated from plasma, the plasma being generated when a target is irradiated with the laser light in a generation region inside the chamber;
   a target supply unit configured to output the target as a droplet toward the generation region;
   a droplet detector configured to detect the droplet in a detection region located between the target supply unit and the generation region; and
   a controller configured to transmit a trigger signal to the laser device, the trigger signal giving a trigger to the laser device to output the laser light,
   the droplet detector transmitting a pass timing signal to the controller, the pass timing signal indicating a timing when the droplet passes through the detection region,
   the controller including a noise compensation unit configured to compensate for noise, the noise being caused by an electromagnetic wave radiated from the plasma and being superimposed on the pass timing signal, and
   the controller transmitting the trigger signal to the laser device based on the pass timing signal in which the noise is compensated for by the noise compensation unit, wherein
   the timing when the droplet passes through the detection region is included in a detection period, the detection period being a period from a time when the droplet enters the detection region to a time when the droplet leaves the detection region,
   the noise compensation unit compensates for the noise by isolating a timing when the noise is superimposed on the pass timing signal from the detection period, and masking the noise superimposed on the pass timing signal at the timing isolated from the detection period, and
   the noise compensation unit isolates the timing when the noise is superimposed on the pass timing signal from the detection period by correcting a velocity of the droplet.

2. The extreme ultraviolet light generation device according to claim 1, wherein
   the target supply unit outputs the target, as the droplet, into the chamber by applying pressure to the target in a molten state, and
   the noise compensation unit corrects the velocity of the droplet by correcting the pressure applied to the target by the target supply unit.

3. The extreme ultraviolet light generation device according to claim 2, wherein
   the noise compensation unit corrects a timing when the trigger signal is transmitted from the controller such that a timing when the droplet, the velocity of which is corrected, reaches the generation region and a timing when the laser light reaches the generation region substantially coincide with each other.

4. An extreme ultraviolet light generation device used together with a laser device configured to output laser light, the extreme ultraviolet light generation device comprising:
   a chamber in which extreme ultraviolet light is generated from plasma, the plasma being generated when a target is irradiated with the laser light in a generation region inside the chamber;
   a target supply unit configured to output the target as a droplet toward the generation region;
   a droplet detector configured to detect the droplet in a detection region located between the target supply unit and the generation region; and
   a controller configured to transmit a trigger signal to the laser device, the trigger signal giving a trigger to the laser device to output the laser light,
   the droplet detector transmitting a pass timing signal to the controller, the pass timing signal indicating a timing when the droplet passes through the detection region,
   the controller including a noise compensation unit configured to compensate for noise, the noise being caused by an electromagnetic wave radiated from the plasma and being superimposed on the pass timing signal, and
   the controller transmitting the trigger signal to the laser device based on the pass timing signal in which the noise is compensated for by the noise compensation unit, wherein
   the timing when the droplet passes through the detection region is included in a detection period, the detection period being a period from a time when the droplet enters the detection region to a time when the droplet leaves the detection region,
   the noise compensation unit compensates for the noise by isolating a timing when the noise is superimposed on the pass timing signal from the detection period, and masking the noise superimposed on the pass timing signal at the timing isolated from the detection period, and
   the noise compensation unit isolates the timing when the noise is superimposed on the pass timing signal from the detection period by correcting a time interval of outputting a plurality of droplets.

5. The extreme ultraviolet light generation device according to claim 4, wherein
   the target supply unit generates the droplets from the target and outputs the droplets into the chamber by applying vibration to the target jetted into the chamber in a molten state, and the noise compensation unit corrects the time interval of the droplets by correcting a frequency of the vibration applied to the target by the target supply unit.

6. An extreme ultraviolet light generation device used together with a laser device configured to output laser light, the extreme ultraviolet light generation device comprising:
- a chamber in which extreme ultraviolet light is generated from plasma, the plasma being generated when a target is irradiated with the laser light in a generation region inside the chamber;
- a target supply unit configured to output the target as a droplet toward the generation region;
- a droplet detector configured to detect the droplet in a detection region located between the target supply unit and the generation region; and
- a controller configured to transmit a trigger signal to the laser device, the trigger signal giving a trigger to the laser device to output the laser light,
- the droplet detector transmitting a pass timing signal to the controller, the pass timing signal indicating a timing when the droplet passes through the detection region,
- the controller including a noise compensation unit configured to compensate for noise, the noise being caused by an electromagnetic wave radiated from the plasma and being superimposed on the pass timing signal, and
- the controller transmitting the trigger signal to the laser device based on the pass timing signal in which the noise is compensated for by the noise compensation unit, wherein
- the timing when the droplet passes through the detection region is included in a detection period, the detection period being a period from a time when the droplet enters the detection region to a time when the droplet leaves the detection region,
- the noise compensation unit compensates for the noise by isolating a timing when the noise is superimposed on the pass timing signal from the detection period, and masking the noise superimposed on the pass timing signal at the timing isolated from the detection period, and
- the noise compensation unit isolates the timing when the noise is superimposed on the pass timing signal from the detection period by correcting a distance from the detection region to the generation region.

7. The extreme ultraviolet light generation device according to claim 6, further comprising
- a moving mechanism configured to move a position of the detection region along a trajectory of the droplet passing through the detection region and the generation region, wherein
- the noise compensation unit corrects the distance from the detection region to the generation region by correcting the position of the detection region with use of the moving mechanism.

8. The extreme ultraviolet light generation device according to claim 7, wherein
- the noise compensation unit corrects the timing when the trigger signal is transmitted from the controller such that the laser light reaches the generation region at a timing when the droplet passing through the detection region with the distance corrected reaches the generation region.

* * * * *